(12) United States Patent
Inatsuka

(10) Patent No.: US 10,050,048 B2
(45) Date of Patent: Aug. 14, 2018

(54) SEMICONDUCTOR MEMORY DEVICE AND METHOD OF MANUFACTURING SEMICONDUCTOR MEMORY DEVICE

(71) Applicant: TOSHIBA MEMORY CORPORATION, Tokyo (JP)

(72) Inventor: Takuya Inatsuka, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/279,927

(22) Filed: Sep. 29, 2016

(65) Prior Publication Data
US 2017/0243877 A1    Aug. 24, 2017

Related U.S. Application Data

(60) Provisional application No. 62/297,619, filed on Feb. 19, 2016.

(51) Int. Cl.
| | |
|---|---|
| H01L 27/11529 | (2017.01) |
| H01L 27/11556 | (2017.01) |
| H01L 27/11573 | (2017.01) |
| H01L 27/11582 | (2017.01) |
| H01L 23/522 | (2006.01) |

(Continued)

(52) U.S. Cl.
CPC .. H01L 27/11529 (2013.01); H01L 21/76802 (2013.01); H01L 21/76832 (2013.01); H01L 21/76877 (2013.01); H01L 23/528 (2013.01); H01L 23/5226 (2013.01); H01L 27/11556 (2013.01); H01L 27/11573 (2013.01); H01L 27/11582 (2013.01); H01L 2221/1063 (2013.01)

(58) Field of Classification Search
None
See application file for complete search history.

(56) References Cited

U.S. PATENT DOCUMENTS

| | | | |
|---|---|---|---|
| 7,952,136 B2 | 5/2011 | Kito et al. | |
| 8,482,138 B2 * | 7/2013 | Hwang | H01L 27/11575 257/786 |

(Continued)

FOREIGN PATENT DOCUMENTS

| | | |
|---|---|---|
| JP | 2008244485 A | 10/2008 |
| JP | 5100080 B2 | 12/2012 |
| JP | 2015097245 A | 5/2015 |

*Primary Examiner* — Jose R Diaz
(74) *Attorney, Agent, or Firm* — Patterson & Sheridan, LLP

(57) ABSTRACT

A semiconductor memory device includes a substrate having a memory region and a peripheral region that are adjacent to each other, and a plurality of insulating layers and a plurality of wiring layers that are alternately formed on the memory region and the peripheral region of the substrate. On the memory region, the insulating layers and the wiring layers are alternately formed along a thickness direction of the memory device. On the peripheral region, first portions of the insulating layers and first portions of the wiring layers are alternately formed along the thickness direction and second portions of the wiring layers and second portions of the wiring layers are alternately formed along a lateral direction. A width of the second portion of each of the wiring layers in the lateral direction is greater than a thickness of the first portion of the wiring layer.

19 Claims, 18 Drawing Sheets

(51) Int. Cl.
*H01L 23/528* (2006.01)
*H01L 21/768* (2006.01)

(56) References Cited

U.S. PATENT DOCUMENTS 8,791,523 B2 * 7/2014 Iino .................... H01L 27/1157
  257/324
2009/0001419 A1   1/2009 Han et al.

* cited by examiner

SEMICONDUCTOR MEMORY DEVICE AND METHOD OF MANUFACTURING SEMICONDUCTOR MEMORY DEVICE

CROSS-REFERENCE TO RELATED APPLICATIONS

This application is based upon and claims the benefit of priority from U.S. Provisional Patent Application No. 62/297,619, filed on Feb. 19, 2016, the entire contents of which are incorporated herein by reference.

FIELD

Embodiments described herein relate generally to a semiconductor memory device and a method of manufacturing a semiconductor memory device.

BACKGROUND

Miniaturization of a semiconductor memory device is desired.

DETAILED DESCRIPTION

Figure 1:
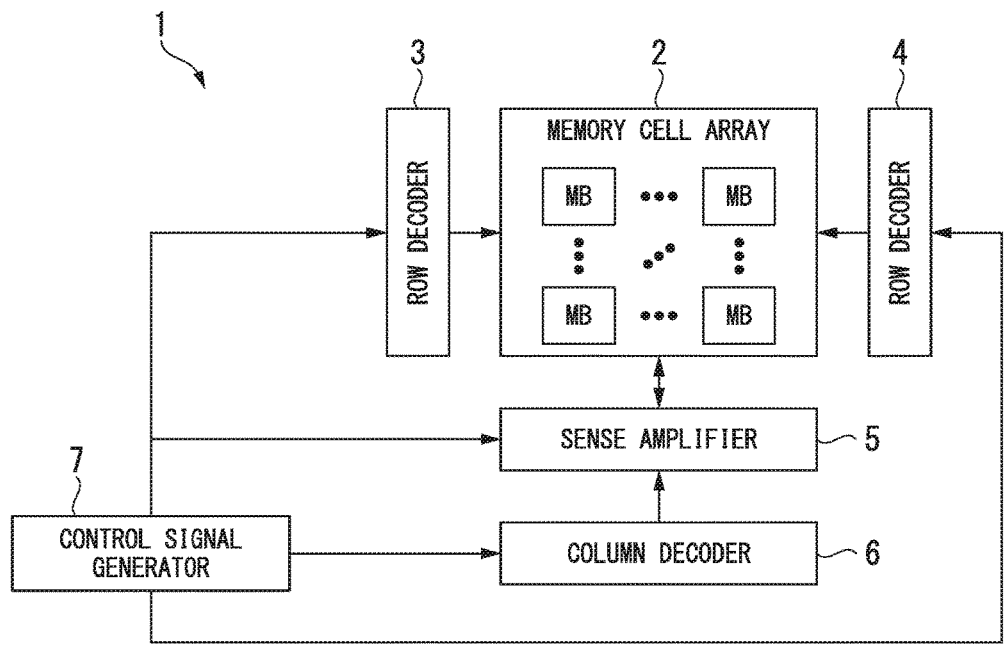
FIG. 1 is a block diagram showing a system configuration of a semiconductor memory device according to a first embodiment.

A semiconductor memory device according an embodiment includes a substrate having a memory region and a peripheral region that are adjacent to each other, and a plurality of insulating layers and a plurality of wiring layers that are alternately formed on the memory region and the peripheral region of the substrate. On the memory region, the insulating layers and the wiring layers are alternately formed along a thickness direction of the memory device. On the peripheral region, first portions of the insulating layers and first portions of the wiring layers are alternately formed along the thickness direction and second portions of the insulating layers and second portions of the wiring layers are alternately formed along a lateral direction. A width of the second portion of each of the wiring layers in the lateral direction is greater than a thickness of the first portion of the wiring layer.

Hereinafter, a semiconductor memory device and a method of manufacturing a semiconductor memory device according to embodiments will be described with reference to the accompanying drawings. In the following description, configurations having the same or similar functions are denoted with the same reference numerals, and repeated description thereof may be omitted. The drawings are schematic, and the number, thickness, width, a ratio, or the like of components may be different from an actual one. Further, in a case in which "connection" is described, this is not limited to a case where two members are physically connected, and also includes a case where two members are electrically connected.

First Embodiment

A first embodiment will be described with reference to FIG. 1 to FIG. 6D.

First, an entire configuration of a semiconductor memory device 1 according to the first embodiment will be described. The semiconductor memory device 1 according to the present embodiment is a nonvolatile semiconductor memory device and is, for example, a NAND-type flash memory.

FIG. 1 is a block diagram showing a system configuration of the semiconductor memory device 1. As showed in FIG. 1, the semiconductor memory device 1 includes a memory cell array 2, row decoders 3 and 4, a sense amplifier 5, a column decoder 6, and a control signal generator 7.

The memory cell array 2 includes a plurality of memory blocks MB. Each memory block MB includes a plurality of memory cells MC (see FIG. 2) that is three-dimensionally arrayed. Each of the row decoders 3 and 4 is an example of a drive circuit that drives at least a part of the memory cell array 2. The row decoders 3 and 4 decode a block address signal or the like, and control a writing operation and a reading operation of data with respect to the memory cell array 2, for example. The sense amplifier 5 detects and amplifies an electrical signal which flows in the memory cell array 2 during the reading operation. The column decoder 6 decodes a column address signal and controls the sense amplifier 5. The control signal generator 7 generates a control signal, and controls the row decoders 3 and 4, the sense amplifier 5, and the column decoder 6.

Figure 2:
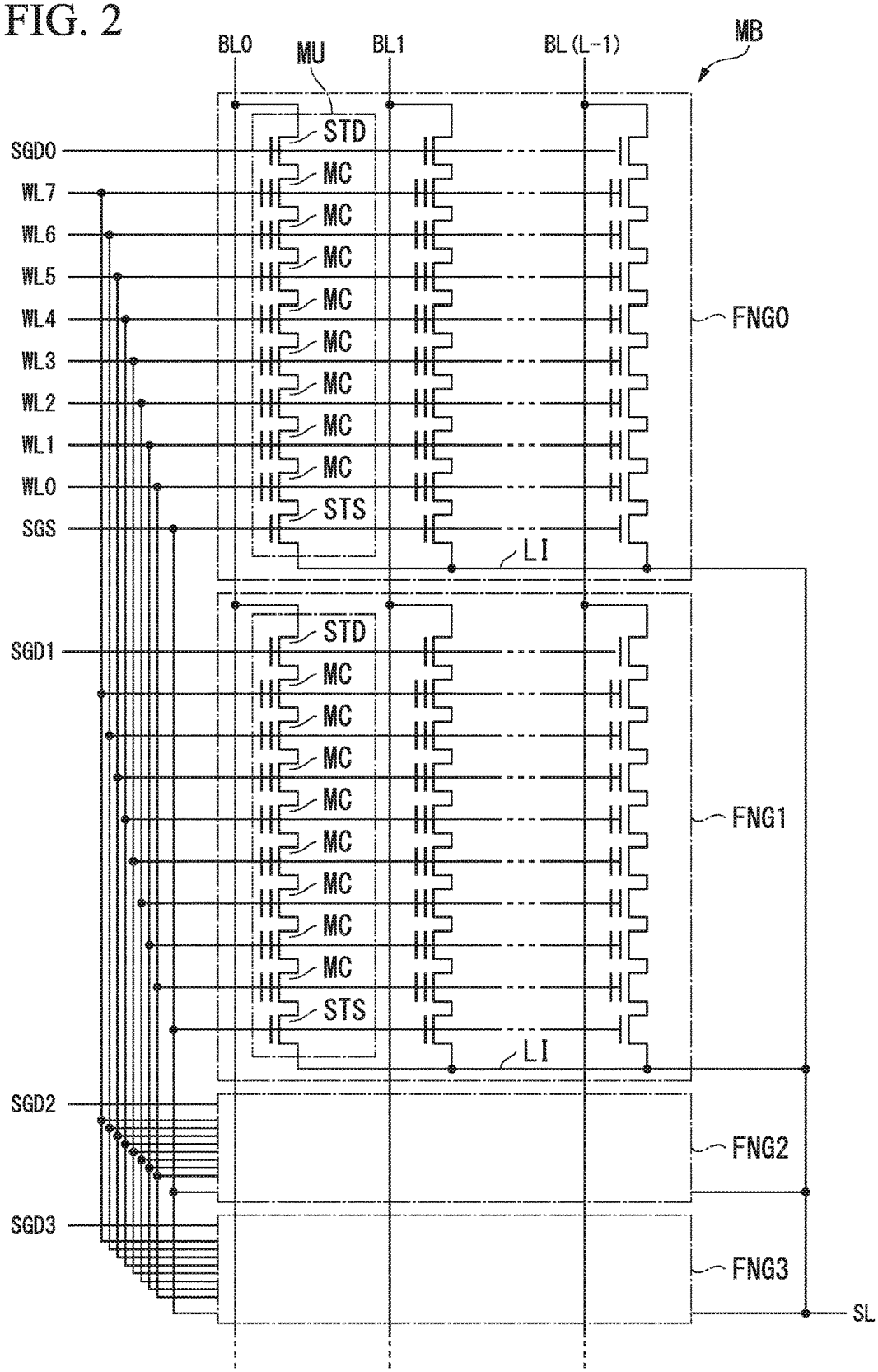
FIG. 2 illustrates an equivalent circuit of a memory cell array of the semiconductor memory device according to the first embodiment.

Next, a circuit configuration of the memory cell array 2 will be described. FIG. 2 shows an equivalent circuit of the memory cell array 2 according to the present embodiment.

As shown in FIG. 2, each memory block MB includes a plurality of fingers FNG (FNG0, FNG1, . . . ). Each finger FNG includes a plurality of memory cell units MU (described below). In each finger FNG one end of each memory cell unit MU is electrically connected to a bit line BL (BL0, BL1, . . . ). The other end of each memory cell unit MU is electrically connected to a source line SL via a source contact LI.

Each memory cell unit MU includes a plurality of memory cells MC, a source-side selection transistor STS, and a drain-side selection transistor STD.

The plurality of memory cells MC in a same memory cell unit MU is electrically connected in series. Each memory cell MC is a transistor including a semiconductor layer, a charge storage layer, and a control gate. Each memory cell MC accumulates charge in the charge storage layer according to a voltage applied to the control gate. Each word line WL (WL0, WL1, . . . ) is commonly connected to the control gates of the plurality of memory cells MC in a same row in different memory cell units MU of each finger FNG of a same memory block MB. The plurality of memory cells MC is electrically connected to the row decoder 3 or the row decoder 4 via the word line WL.

The source-side selection transistor STS is connected between the source contact LI and the plurality of memory cells MC of the same memory cell unit MU. A source-side selection gate line SGS commonly is connected to control gates of the source-side selection transistors STS in a memory block MB. The source-side selection gate line SGS is electrically connected to the row decoder 3 or the row decoder 4. The source-side selection gate line SGS connects the memory cell units MU of a memory block MB to a semiconductor substrate 10 (see FIG. 3) according to an input signal.

The drain-side selection transistor STD is connected between the bit line BL and the plurality of memory cells MC of the same memory cell unit MU. Each of the drain-side selection gate lines SGD (SGD0, SGD1, . . . ) is connected to control gates of the drain-side selection transistors STD of the corresponding finger FNG. The drain-side selection gate line SGD is electrically connected to the row decoder 3 or the row decoder 4. The drain-side selection gate line SGD selectively connects the memory cell units MU to the bit lines BL according to an input signal.

Figure 3:
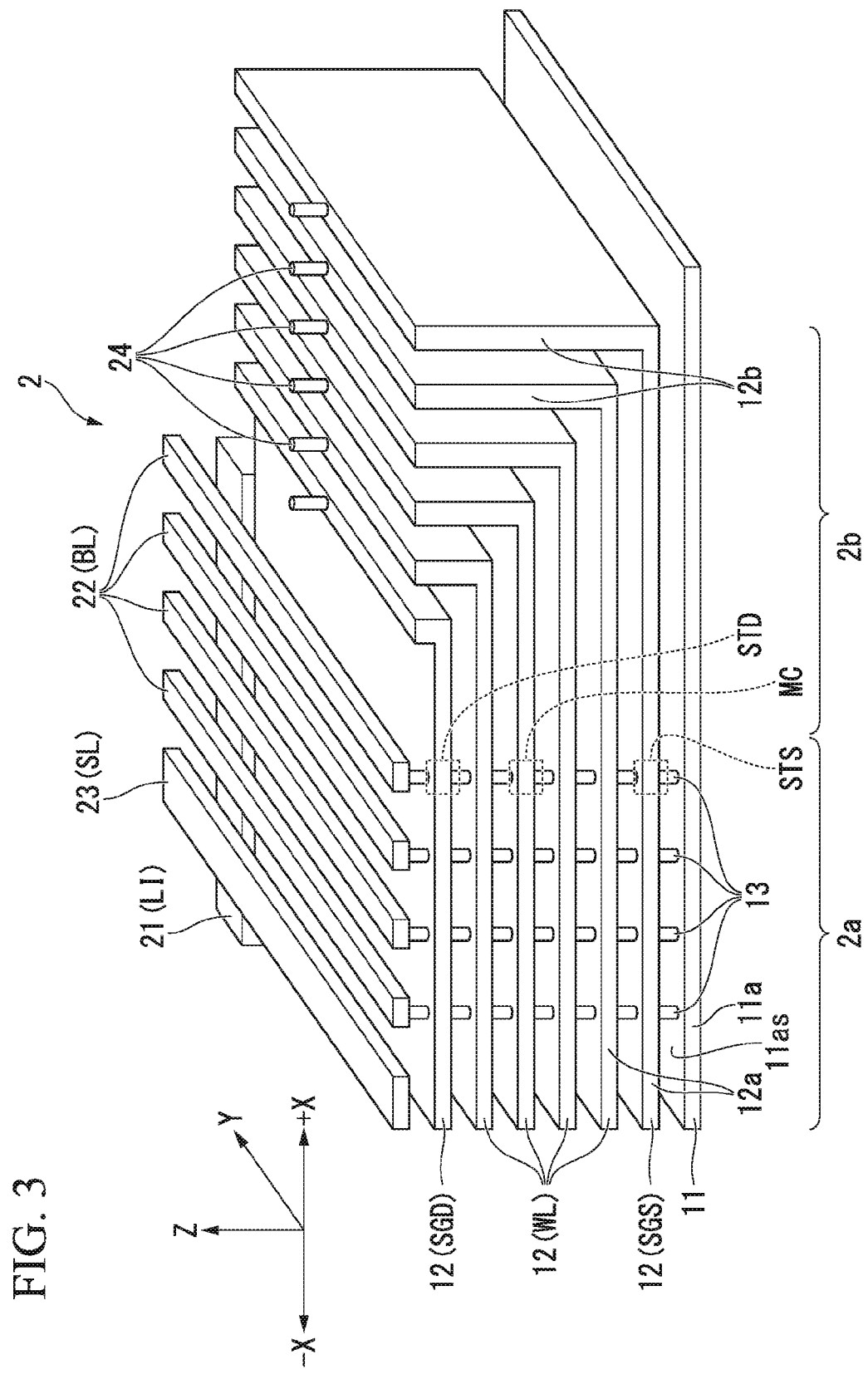
FIG. 3 is a perspective view of the memory cell array according to the first embodiment.

A configuration of the memory cell array 2 will be described below. FIG. 3 schematically shows the configuration of the memory cell array 2 in the present embodiment. In FIG. 3, the insulating material and the like for enclosing the memory cell array 2 are not illustrated.

As shown in FIG. 3, the memory cell array 2 includes a memory area 2a and a contact area 2b. The term "memory area" in the present embodiment refers to an area in which the plurality of memory cells MC is formed. The term "contact area" in the present embodiment refers to an area in which contacts used to apply voltages to the memory cells MC are formed.

Here, +X direction, −X direction, Y direction, and Z direction are defined. +X direction, −X direction, and Y direction are directions along a surface of the semiconductor substrate 11. +X direction is a direction from the memory area 2a toward the contact area 2b. −X direction is a direction opposite to +X direction. Y direction is a direction that intersects with (e.g., substantially perpendicular to) +X direction and −X direction. Z direction is a direction that intersects with (e.g., substantially perpendicular to) +X direction, −X direction, and Y direction and is a thickness direction of the semiconductor substrate 11.

Next, structure common in the memory area 2a and the contact area 2b will be described.

Figure 5:
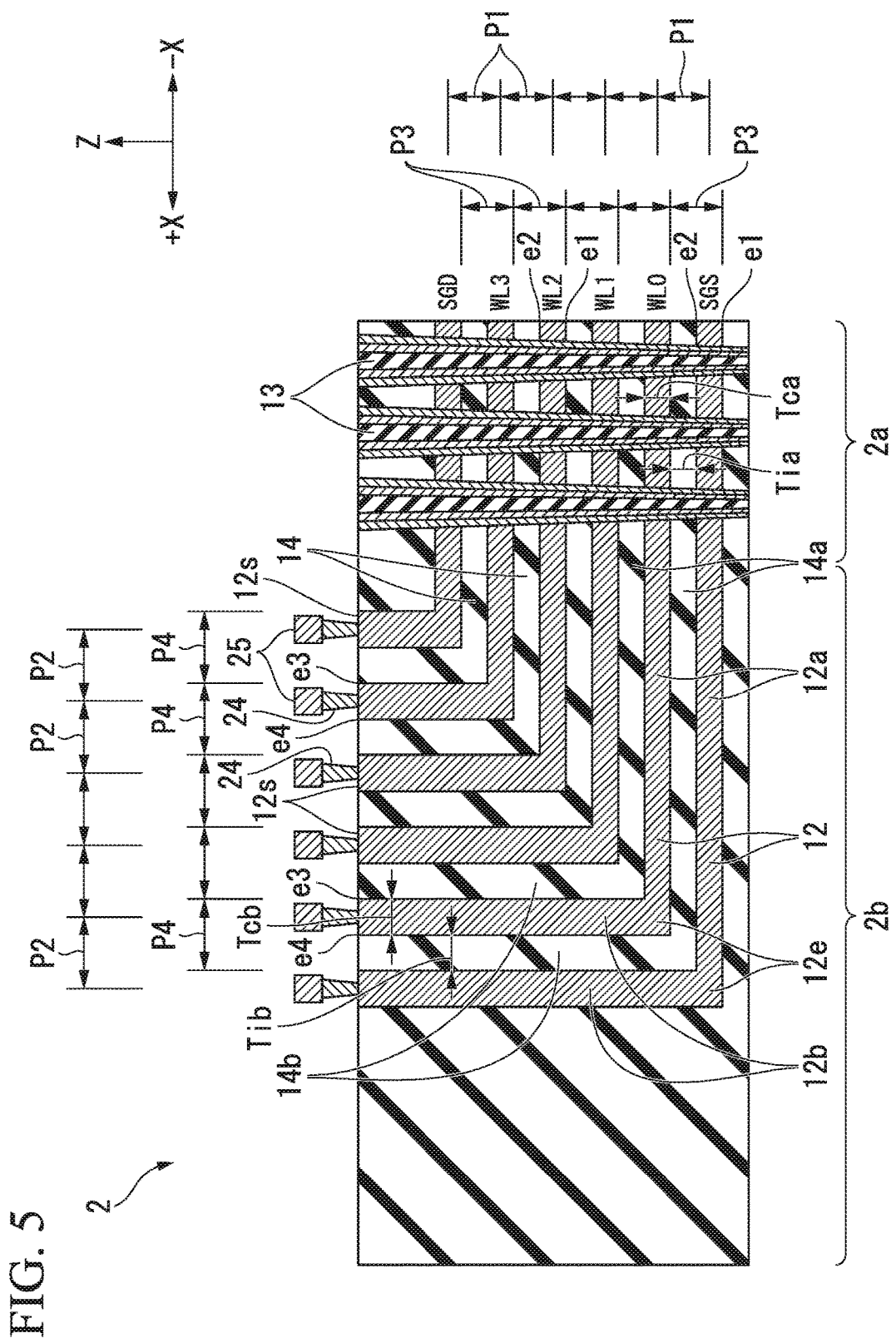
FIG. 5 is a cross-sectional view of the memory cell array according to the first embodiment.

As shown in FIG. 3, the memory cell array 2 includes the semiconductor substrate 11, a plurality of conductive layers 12, and a plurality of insulating layers 14 (refer to FIG. 5). The semiconductor substrate 11, the plurality of conductive layer 12, and the plurality of insulating layer 14 are each provided over the memory area 2a and the contact area 2b.

The semiconductor substrate 11 is an example of a "substrate", and is formed in plate shape, for example.

The plurality of conductive layers 12 and the plurality of insulating layers 14 are alternately stacked onto the semiconductor substrate 11. Each conductive layer 12 is made of, for example, tungsten (W) or polysilicon (poly-Si). Each of the insulating layers 14 is made of, for example, silicon oxide ($SiO_2$).

The plurality of conductive layers 12 forms a plurality of word lines WL, a source-side selection gate line SGS, and a drain-side selection gate line SGD. For example, among the plurality of conductive layers 12, a conductive layer 12 closest to the semiconductor substrate 11 forms the source-side selection gate line SGS. For example, among the plurality of conductive layers 12, a conductive layer 12 farthest from the semiconductor substrate 11 forms the drain-side selection gate line SGD. Among the plurality of conductive layers 12, the other conductive layers 12 disposed between the above-described two conductive layers 12 form the plurality of word lines WL. Although the drain-side selection gate line SGD is shown as a plate shape in FIG. 3 in schematic form, it is actually separated into multiple portions in the Y direction. A contact plug 24, to be described below, is connected to each of the divided drain-side selection gate lines SGD.

Next, a configuration of the memory area 2a will be described. The memory area 2a includes a plurality of memory pillars 13, a conductive layer 21, and conductive lines 22 and 23.

Each memory pillar 13 extends in Z direction and passes through one of the source-side selection gate lines SGS, the plurality of word lines WL, and the drain-side selection gate line SGD. The intersection part of the memory pillar 13 and the source-side selection gate line SGS forms the source-side selection transistor STS. The intersection part of the memory pillar 13 and each word line WL forms a memory cell MC. The intersection part of the memory pillar 13 and the drain-side selection gate line SGD forms the drain-side selection transistor STD.

The conductive layer 21 faces side surfaces of the plurality of conductive layers 12 in Y direction. The conductive layer 21 extends in +X direction. The conductive layer 21 is in contact with the semiconductor substrate 11 and forms a source contact LI that connects the source line SL and the semiconductor substrate 11.

The conductive lines 22 and 23 are formed on a side opposite to the semiconductor substrate 11, so as to sandwich the memory pillars 13 and the conductive layer 21. The plurality of conductive lines 22 and 23 are arranged with intervals therebetween in +X direction, each extending in Y direction. The conductive lines 22 are electrically connected to the memory pillars 13 and form the bit lines BL. The conductive line 23, is electrically connected to the conductive layer 21 and forms the source line SL.

Next, the contact area 2b will be described. The contact area 2b includes a plurality of contact plugs 24 and conductive lines 25 (refer to FIG. 5).

Each contact plug 24 is an example of a "contact." Each of the contact plugs 24 is a circular pillar-shaped via extending in Z direction. The contact plugs 24 are made of, for example, tungsten (W). The contact plugs 24 are electrically connected to the plurality of conductive layers 12 that form the word lines WL, the source-side selection gate line SGS, and the drain-side selection gate line SGD. The connecting structure between the contact plugs 24 and the conductive layers 12 will be described in detail below.

The plurality of conductive lines 25 is provided on the plurality of contact plugs 24 on a side opposite to the semiconductor substrate 11. Each conductive line 25 is connected to a corresponding contact plug 24. The conductive lines 25 and the contact plugs 24 electrically connect the conductive layers 12 and the row decoders 3 and 4.

Figure 4:
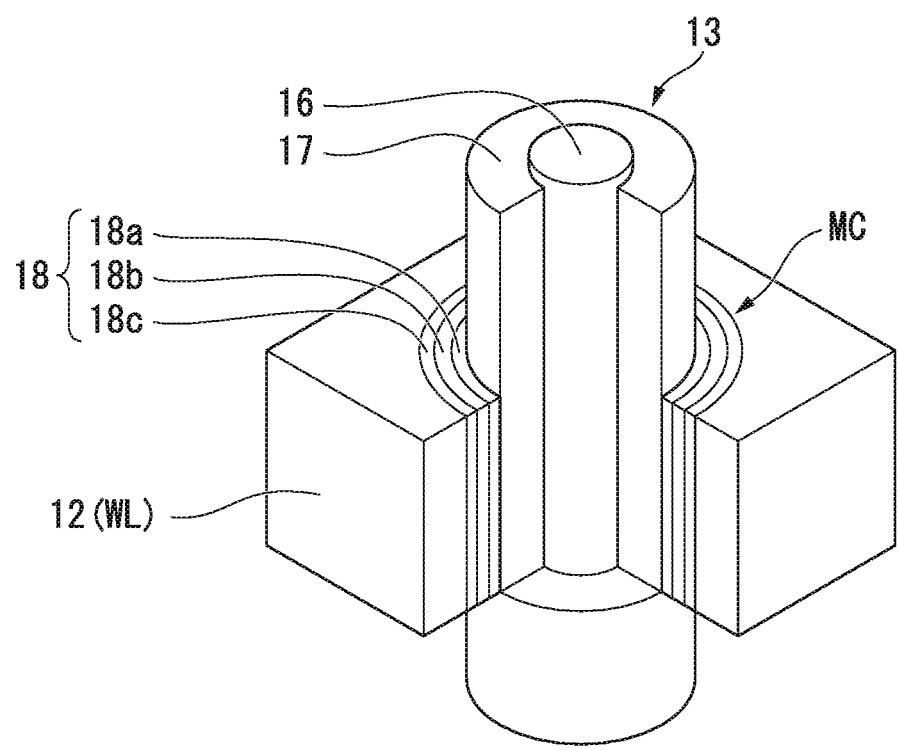
FIG. 4 is a perspective view of a memory cell of the memory cell array according to the first embodiment.

FIG. 4 is an example of a configuration of a memory cell MC.

As shown in FIG. 4, the memory cell MC is formed at the intersection part of each word line WL and each memory pillar 13. Each memory pillar 13 includes a core insulating layer 16 and a semiconductor layer 17.

The core insulating layer 16 is made of, for example silicon oxide ($SiO_2$). The semiconductor layer 17 covers a side surface (e.g., peripheral surface) of the core insulating layer 16. The semiconductor layer 17 is made of, for example, polysilicon (poly-Si) and functions as a channel of the memory cell MC.

The memory cell MC includes a multilayer film 18 between the conductive layer 12 and the semiconductor layer 17 of the memory pillar 13. The multilayer film 18 includes a tunnel insulating film 18a, a charge storage layer 18b, and a cover insulating layer 18c. The tunnel insulating film 18a is made of, for example, silicon oxide ($SiO_2$). The charge storage layer 18b is made of a material that can store an electrical charge, such as, for example, silicon nitride (SiN). The cover insulating layer 18c is made of, for example, silicon oxide ($SiO_2$). According to such a configuration, by applying a voltage to a word line WL and a bit line BL, a charge is stored in the charge storage layer 18b.

The source-side selection transistor STS and the drain-side selection transistor STD may also have a configuration as the one shown in FIG. 4.

Next, the contact area 2b will be described in detail. FIG. 5 is a cross-sectional enlarged view of the contact area 2b and the surrounding area. For convenience in description, the drawings of FIG. 5 and thereafter are presented reversed in X direction with respect to FIG. 3.

As shown in FIG. 5, in the present embodiment, each of the plurality of conductive layers 12 that form the word lines WL, the source-side selection gate line SGS, and the drain-side selection gate line SGD are formed in an L-shape.

More specifically, each of the conductive layers 12 has at least a first part 12a and a second part 12b.

The first parts (i.e., first conductive part) 12a of the conductive layers 12 are stacked on the semiconductor substrate 11 in a first direction (e.g., Z direction), which is the thickness direction of the semiconductor substrate 11. The first part 12a is formed in a plate shape (i.e., sheet shape) and is substantially parallel to the semiconductor substrate 11. The first part 12a is formed in the memory area 2a and the contact area 2b. Semiconductor elements such as memory cells MC, the source-side selection transistors STS, or the drain-side selection transistors STD are formed in the first part 12a.

As shown in FIG. 5, the first parts 12a of the plurality of conductive layers 12 have mutually different lengths in the direction from the memory area 2a toward the contact area 2b (e.g., +X direction). Specifically, the longer the first parts 12a of the plurality of conductive layers 12 are in +X direction, the closer they are to the semiconductor substrate 11. For that reason, ends 12e of the first parts 12a of the plurality of conductive layers 12 on +X-direction side do not overlap in Z direction.

In contrast, a second part (i.e., second conductive part) 12b extends from the end 12e of the +X-direction-side of the first part 12a in a direction that intersects with the first part 12a. For that reason, each of the conductive layers 12 in the present embodiment, when viewed in Y direction, has the L shape. The "direction that intersects" in the present embodiment is not limited to a perpendicular direction and may be a direction that intersects with inclination. As shown in FIG. 5, the second parts 12b of the plurality of conductive layers 12 are arranged in a second direction (e.g., +X direction) that intersects with the first direction. If the second parts 12b are inclined with respect to the semiconductor substrate 11, the second direction is also inclined with respect to the semiconductor substrate 11.

The farther the second part 12b of the plurality of conductive layers 12 is from the memory area 2a, the longer the second part 12b extends from the end 12e of the first part 12a. As a result, the second parts 12b of the plurality of conductive layers 12 extend to substantially the same position (e.g., substantially the same height) in Z direction. Each of the second parts 12b of the plurality of conductive layers 12 has an end surface 12s to which the contact plug 24 is connected (e.g., physically connected).

Also, as shown in FIG. 5, each of the plurality of insulating layers 14 has at least a first insulating part 14a and a second insulating part 14b. Each of the first insulating parts 14a is between the first parts 12a of two adjacent conductive layers 12. A thickness Tia of the first insulating part 14a in the first direction corresponds to distance (e.g., interlayer distance) between the first parts 12a of the two adjacent conductive layers 12. On the other hand, each of the second insulating parts 14b is formed between the second parts 12b of two adjacent conductive layers 12. A thickness Tib of the second insulating part 14b in the second direction corresponds to distance (e.g., interlayer distance) between the second parts 12b of the two adjacent conductive layers 12.

Next, intervals between the plurality of conductive layers 12 will be described.

First, as a premise, as shown in FIG. 3, the semiconductor substrate 11 includes a region 11a in which the first parts 12a of the plurality of conductive layers 12 and the first insulating parts 14a of the plurality of insulating layers 14 overlap in the first direction. The region 11a has a surface 11as, which extends out substantially in parallel with the first parts 12a of the plurality of conductive layers 12 and the first insulating parts 14a of the plurality of insulating layers 14.

As shown in FIG. 5, each of the first parts 12a of the plurality of semiconductor layers 12 has a first edge e1 and a second edge e2 that is opposite to the first edge e1 in the first direction. The "first edge" and "second edge" in the present embodiment are, lines that are included in the contour of an cross-section of the first part 12a exposed at the cutting plane and that cross a first virtual line if the first virtual line is drawn with respect to the cross-section along the first direction, when the semiconductor memory device 1 is cut along an arbitrary cutting plane along the first direction. The +X-direction position and the Y-direction position of the first virtual line may be arbitrary.

The first edge e1 is closer to the region 11a (e.g., closer to the surface 11as of the region 11a) of the semiconductor substrate 11 than the second edge e2 is.

In the present embodiment, the center lines of the thickness in the first direction of the first parts 12a of the plurality of conductive layers 12 are disposed at a first interval P1 in the first direction. The "center line of thickness in the first direction," as used in the present embodiment is a virtual line that passes through the center between the above-noted first edge e1 and second edge e2 in an cross-section of the first part 12a exposed at the cutting plane when the semiconductor memory device 1 is cut along an arbitrary cutting plane along the first direction. According to an example of a more precise definition, if a plurality of first virtual lines are drawn along the first direction on the cross-section of the first part 12a exposed at the cutting plane and, in each first virtual line, the intersection point of each first virtual line and the first edge e1 is taken to be the first point, the intersection point of each first virtual line and the second edge e2 is taken to be the second point, and the central position between the first point and the second point is taken to be the center point, the "center line of thickness in the first direction" corresponds to the line joining the center points of the plurality of first virtual lines.

In the present embodiment, the first interval P1 is an interval between the center lines of the thickness of the first parts 12a of two adjacent conductive layers 12 of the plurality of conductive layers 12 in the first direction. In the present embodiment, the first intervals P1 are substantially the same as each other among the plurality of conductive layers 12 (e.g., all of the conductive layers 12). That is, in the present embodiment, the first parts 12a of the plurality of conductive layers 12 are disposed at a substantially uniform interval in the first direction.

In the same manner, each of the second parts 12b of the plurality of conductive layers 12 has a third edge e3 and a fourth edge e4 that is opposite to the third edge e3 in the second direction. The "third edge" and "fourth edge" in the present embodiment are lines that are included in the contour of the end face 12s of the second part 12b of the conductive layer 12 to which the contact plug 24 is connected, and cross a second virtual line if the second virtual line is drawn with respect to the end face 12s along the second direction. The Z-direction position and the Y-direction position of the second virtual line may be arbitrary.

The third edge e3 is closer, than the fourth edge e4 is, to the memory cell MC, the source-side selection transistor STS, and the drain-side selection transistor STD formed in the first parts 2a of the conductive layers 12 (i.e., to the semiconductor element provided in the first part 2a).

In the present embodiment, the center lines of the thickness of the second parts 12b of the plurality of conductive layers 12 in the second direction are disposed at a second interval P2 in the second direction. The "center line of the thickness in the second direction," as used in the present embodiment is a virtual line that passes through the center between the above-noted third edge e3 and the fourth edge e4 at the end face 12s of the second part 12b of conductive layer 12 to which the contact plug 24 is connected. According to an example of a more precise definition, if a plurality of second virtual lines are drawn along the second direction on the end face 12s of the second part 12b, in each second virtual line, the intersection point of each second virtual line and the third edge e3 is taken to be the third point, the intersection point of each second virtual line and the fourth edge e4 is taken to be the fourth point, and the center position between the third point and the fourth point is taken to be the center point, the "center line of the thickness in the second direction" corresponds to the line joining the center points of the plurality of second virtual lines.

In the present embodiment, the second interval P2 is an interval between the center lines of the thickness of the second parts 12b of two adjacent conductive layers 12 of the plurality of conductive layers 12 in the second direction. In the present embodiment, the second intervals P2 are substantially the same each other among the plurality of conductive layers 12 (e.g., all of the conductive layers 12). That is, in the present embodiment, the second parts 12b of the plurality of conductive layers 12 are disposed at a substantially uniform interval in the second direction.

In the present embodiment, the second interval P2 is greater than the first interval P1.

The intervals of the conductive layers 12 will now be described from a different standpoint.

As shown in FIG. 5, the first edges e1 of the first parts 12a of the plurality of conductive layers 12 are disposed at a first interval P3 in the first direction. The first interval P3 is an interval between the first edges e1 of the first parts 12a of two adjacent conductive layers 12 of the plurality of conductive layers 12. Described differently, the first interval P3 is the distance resulting by adding the thickness Tca of the first part 12a of one conductive layer 12 in the first direction to the thickness Tia of a first insulating part 14a of one insulating layer 14 that is adjacent to the conductive layer 12 in the first direction. In the present embodiment, the first intervals P3 are substantially the same each other among the plurality of the conductive layers 12 (e.g., all of the conductive layers 12).

On the other hand, the third edges e3 of the second parts 12b of the plurality of conductive layers 12 are disposed at a second interval P4 in the second direction. The second interval P4 is an interval between the third edges e3 of second parts 12b of two adjacent conductive layers 12 of the plurality of conductive layers 12. Described differently, the second interval P4 is the distance resulting by adding the thickness Tcb of the second part 12b of one conductive layer 12 in the second direction to the thickness Tib of the second insulating part 14b of one insulating layer 14 that is adjacent to the conductive layer 12 in the second direction. In the present embodiment, the second intervals P4 are substantially the same each other among the plurality of the conductive layers 12 (e.g., all of the conductive layers 12). The third edge e3 is an example of a "first edge" in a different standpoint. The fourth edge e4 is an example of a "second edge" in a different standpoint.

In the present embodiment, the second interval P4 is greater than the first interval P3.

The definitions of the first and second intervals P1, P2, P3, and P4 are the same in all of the embodiments and modifications described below.

In the present embodiment, in each of the insulating layers 14, the thickness Tib of the second insulating part 14b in the second direction is thicker than the thickness Tia of the first insulating part 14a in the first direction.

Additionally, in the present embodiment, in each conductive layer 12, the thickness Tcb of the second part 12b in the second direction is thicker than the thickness Tca of the first part 12a in the first direction.

According to the above-described configuration of the present embodiment, the second intervals P2 and p4 are greater than the first intervals P1 and P3, respectively.

Next, a method of manufacturing the semiconductor memory device 1 according to the present embodiment will be described, with references to FIG. 6A to FIG. 6D. In the following, the parts related to the formation of the second parts 12b of the conductive layers 12 and the second insulating parts 14b of the insulating layers 14 will be described. In the following description, the directions moving away from and toward the region 11a of the semiconductor substrate 11 may be referred to as upward and downward, respectively. In FIG. 6A to FIG. 6D, the semiconductor substrate 11 is not shown.

Figure 6A:
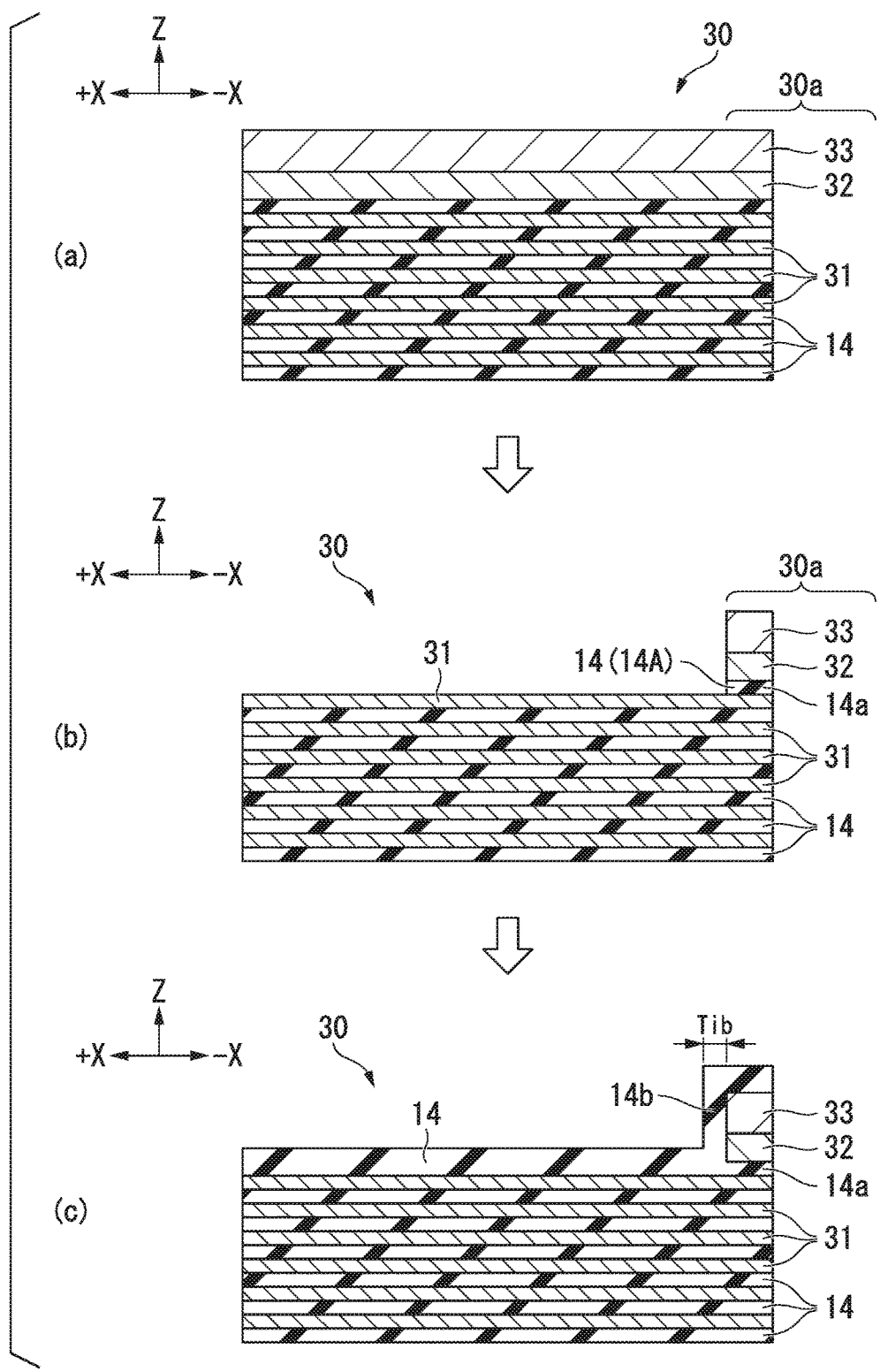
FIGS. 6A-6D are a cross-sectional view of layers to show a method of manufacturing the memory cell array of the first embodiment.

First, as shown in (a) of FIG. 6A, insulating layers 14 (i.e., first layers) and intermediate layers 31 (i.e., second layers) are alternately stacked in the first direction (e.g., Z direction)

on the region 11a of the semiconductor substrate 11, thereby forming a stacked body 30. The insulating layers 14, as described above, are made of, for example, silicon oxide ($SiO_2$). The intermediate layers 31 may itself serve as the conductive layers 12, or may be sacrificial layers that are replaced by conductive layers 12 during a subsequent process. The intermediate layers 31 that itself serve as the conductive layers 12 are made of, for example tungsten (W) or polysilicon (poly-Si). The intermediate layers 31 that serve as the sacrificial layers are made of, for example, silicon nitride (SiN). A stopper layer 32 and a hard mask 33 are formed on an uppermost-positioned insulating layer 14. The stopper layer 32 is a stopper layer for CMP (chemical mechanical polishing). The hard mask 33 covers the memory formation region 30a of the stacked body 30. At the completion of manufacturing the semiconductor memory device 1, the memory formation region 30a is a region corresponding to the memory area 2a. The hard mask 33 has a selectivity ratio with respect to the insulating layer 14 and the intermediate layer 31 when etching is done. The hard mask 33 is an example of a "mask."

Next, as shown in (b) of FIG. 6A, opening is formed in the stopper layer 32 and the hard mask 33, and a part of the uppermost-positioned insulating layer 14 (e.g., insulating layer 14A) of the plurality of insulating layers 14 is etched. Specifically, the insulating layer 14 is etched until the intermediate layer 31 positioned one layer below the insulating layer 14 is exposed. Described differently, one insulating layer 14 is removed using anisotropic dry etching. The "until the layer one layer below is exposed" in the present embodiment includes not only a case where the layer to be etched is completely removed and the layer positioned one layer therebelow is exposed, but also a case where a layer positioned one layer therebelow is exposed, with a part of the layer to be etched remaining.

When the etching is performed, the region covered by the hard mask 33 is not processed. For that reason, at a position corresponding to the edge of the hard mask 33, a side surface (i.e., end surface) of the first insulating part 14a of one insulating layer 14 is exposed to the outside of the stacked body 30.

Next, as shown in (c) of FIG. 6A, an insulating material is stacked onto the stacked body 30, with the first insulating part 14a of the insulating layer 14 remaining on the stacked body 30. This process forms the second insulating part 14b of the insulating layer 14, which is connected to the first insulating part 14a of the insulating layer 14 and also extends from the end of the first insulating part 14a in the direction intersecting with the first insulating part 14a. For example, the second insulating part 14b of the insulating layer 14 is formed along side surfaces (i.e., end surfaces) of the stopper layer 32 and the hard mask 33. When this process is performed, by controlling the film thickness of the insulating layer 14 being stacked onto the stacked body 30, the thickness Tib of the second insulating part 14b of the insulating layer 14 in the second direction (e.g., the +X direction) can be made a desired thickness.

Figure 6B:
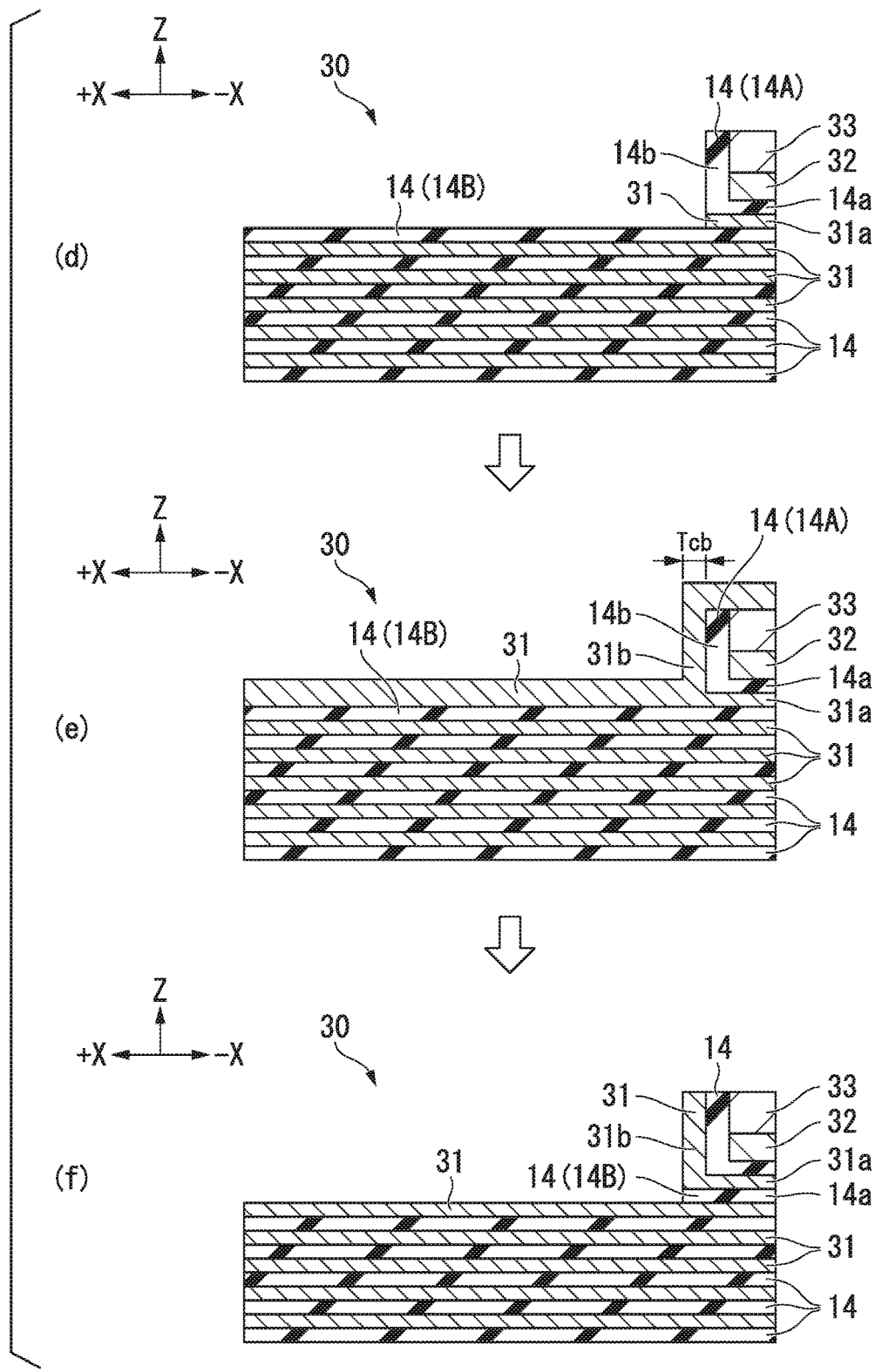

Next, as shown in (d) of FIG. 6B, in a pair of the insulating layer 14 stacked through the above-described process shown in (c) of FIG. 6A and the intermediate layer 31 one layer therebelow, a part of the insulating layer 14 and a part of the intermediate layer 31 are etched. Specifically, an unnecessary part of the insulating layer 14 stacked through the above-described process shown in (c) of FIG. 6A (e.g., the part other than the second insulating part 14b) is etched back by anisotropic dry etching. After that, the intermediate layer 31 is anisotropically dry etched to remove it until the insulating layer 14 (e.g., insulating layer 14B) positioned one layer below the intermediate layer 31 is exposed. This process exposes a side surface (i.e., end surface) of a first part 31a of one intermediate layer 31 to the outside of the stacked body 30. The first part 31a of the intermediate layer 31 is the part that will become the first part 12a of the conductive layer 12.

Next, as shown in (e) of FIG. 6B, a material substantially the same as the intermediate layer 31 is stacked onto the stacked body 30, with the first part 31a of the intermediate layer 31 remaining on the stacked body 30. This process forms a second part 31b of the intermediate layer 31, which is connected to the first part 31a of the intermediate layer 31 and also extends from the end of the first part 31a in the direction intersecting with the first part 31a. The second part 31b of the intermediate layer 31 will become the second part 12b of the conductive layer 12. For example, the second part 31b of the intermediate layer 31 is formed along the second insulating part 14b of the insulating layer 14 formed through the above-described process shown in (c) of FIG. 6A. When this process is performed, by controlling the film thickness of the intermediate layer 31 stacked onto the stacked body 30, the thickness of the second part 31b of the intermediate layer 31 in the second direction (i.e., the thickness Tcb of the second part 12b of the conductive layer 12 in the second direction) can be made a desired thickness.

Next, as shown in (f) of FIG. 6B, in the pair formed by the intermediate layer 31 stacked through the above-described process shown in (e) of FIG. 6B and the insulating layer 14 (e.g., insulating layer 14B) positioned one layer therebelow, a part of the intermediate layer 31 and a part of the insulating layer 14 are etched. Specifically, an unnecessary part of the intermediate layer 31 stacked through the above-described process shown in (e)_ of FIG. 6B (e.g., the part other than the second part 31b) is etched back by anisotropic dry etching. After that, the insulating layer 14 (e.g., insulating layer 14B) is removed by anisotropic dry etching until the intermediate layer 31 positioned one layer below the insulating layer 14 is exposed. This process exposes a side surface (i.e., end surface) of the first insulating part 14a of one insulating layer 14 (e.g., insulating layer 14B) to the outside of the stacked body 30.

Figure 6C:
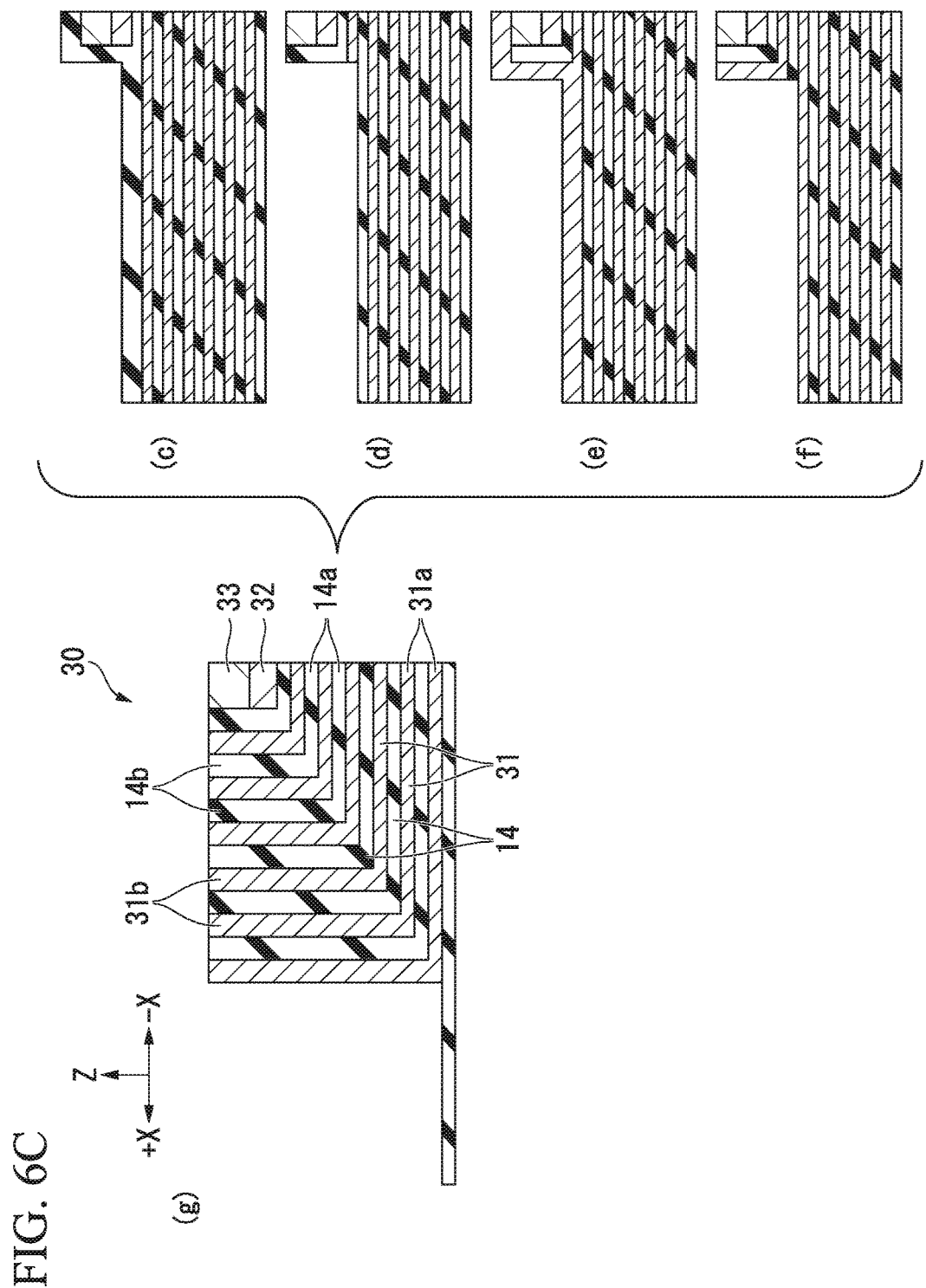

Then, as shown in (g) of FIG. 6C, the above-described processes shown in (c) to (f) of FIGS. 6A and 6B are repeated a number of times corresponding to the number of insulating layers 14 and intermediate layers 31, thereby forming the second insulating parts 14b of the plurality of insulating layers 14 and the second parts 31b of the plurality of intermediate layers 31.

Figure 6D:
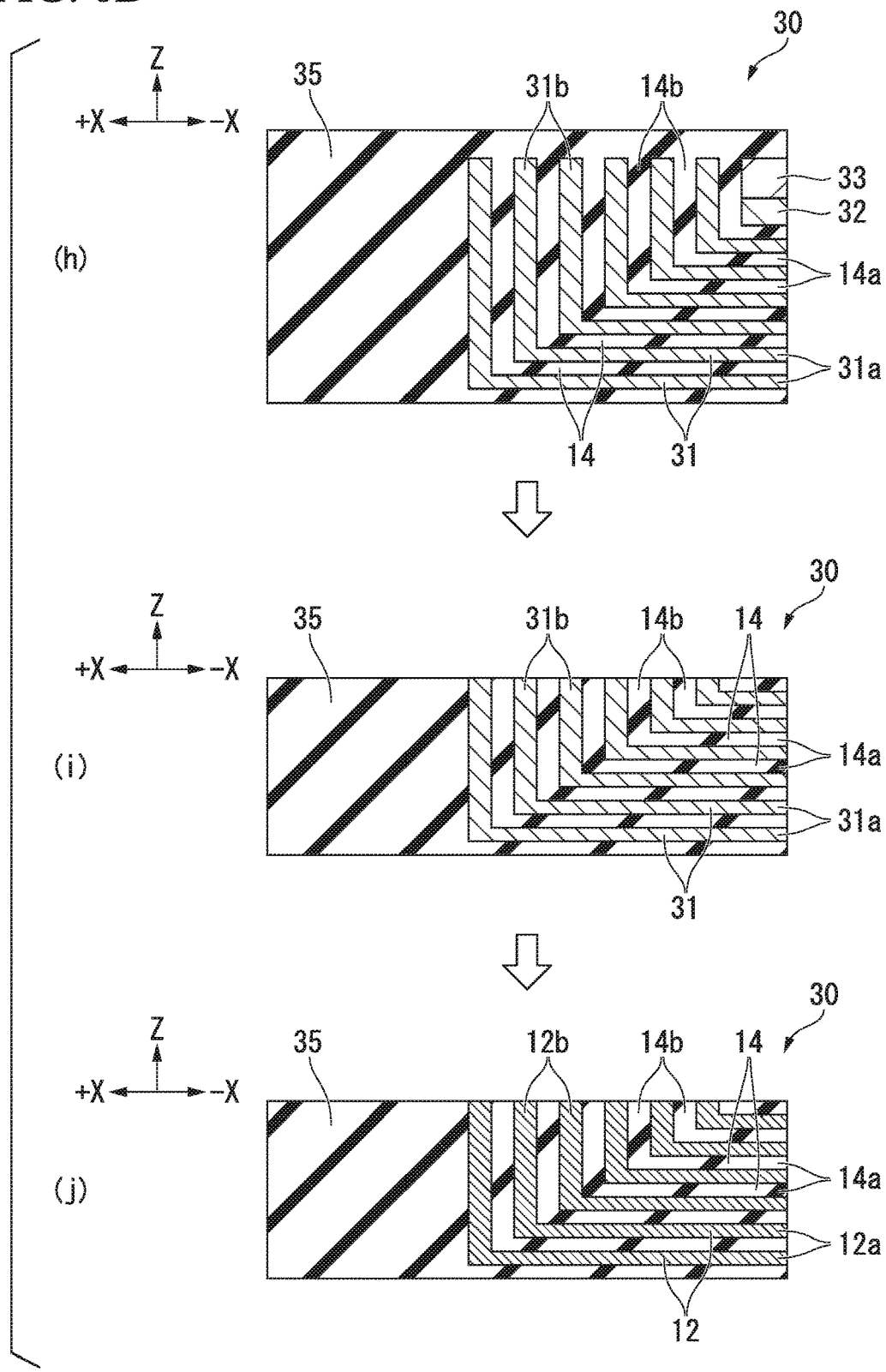

As shown in (h) of FIG. 6D, an insulating layer 35 is formed with respect to the semiconductor substrate 11 so as to enclose the plurality of insulating layers 14 and intermediate layers 31. The insulating layer 35 is made of, for example, TEOS (tetraethoxysilane).

Next, as shown in (i) of FIG. 6D, planarization processing is performed. By performing this process, the stopper layer 32 and the hard mask 33 are removed. In this case, if the intermediate layers 31 serves as the conductive layers 12, the contact plugs 24 and conductive lines 22, 23, and 25 and the like are formed, thereby completing manufacturing of the semiconductor memory device 1.

On the other hand, as shown in (j) of FIG. 6D, if the intermediate layers 31 are the sacrificial layers, a process of replacing the sacrificial layers with the conductive layers 12 is carried out. After that, the contact plugs 24 and conductive lines 22, 23, and 25 and the like are formed, thereby completing manufacturing of the semiconductor memory device 1.

Regarding the semiconductor memory device 1 of second to the fourth embodiments and the modification thereof to be described below, the method of manufacturing the semiconductor memory device 1 of those embodiments is substantially the same as the one described above.

According to the above-described configuration, it is possible to miniaturize the semiconductor memory device 1.

As comparison example 1, it is considered that a semiconductor memory device has a plurality of terraces formed in stepped fashion by a plurality of conductive layers and contact plugs connected to the plurality of terraces. According to such a semiconductor memory device, in order to provide a margin for variations in lithography and slimming, the surface area of each of the above-noted plurality of terraces would have to be formed larger.

As comparison example 2, it is considered that in addition to a trench in substrate or in a deposit on a substrate, conductive layers and insulating layers are stacked on the inner surface (e.g., inclined surface) of the trench, and the conductive layers are led out upward. In this case, it would be difficult to control the interconnect pitch of the parts stacked on the inclined surface of the trench, and the interconnect pitch tends to become smaller than the interconnect pitch of the parts stacked on the trench base surface. For that reason, the voltage breakdown strength between adjacent conductive layers would worsen.

In contrast, according to the present embodiment, the plurality of conductive layers 12 includes the first and second conductive layers. The interval P4 in the second direction between the third edge e3 of the second part 12b of the first conductive layer and the third edge e3 of the second part 12b of the second conductive layer is greater than the interval P3 in the first direction between the first edge e1 of the first part 12a of the first conductive layer and the first edge e1 of the first part 12a of the second conductive layer. Each of the "first conductive layer" and "second conductive layer" may be any of the word lines WL, the source-side selection gate line SGS, and the drain-side selection gate line SGD. Also, both the "first conductive layer" and "second conductive layer" may be word lines WL.

According to the configuration of the present embodiment, as compared to a case of a plurality of terraces formed in stepped fashion, because the variation in lithography or slimming is either reduced or eliminated, it is possible to reduce the surface area required for lead-outs of the conductive layers 12. As a result, it is possible to make the semiconductor memory device 1 smaller. Also, according to the configuration of the present embodiment, it is possible to secure a certain minimum distance between the second parts 12b of the plurality of conductive layers 12. As a result, it is possible to increase the voltage breakdown margin of the conductive layers 12.

Second Embodiment

Next, a semiconductor memory device 1 according to a second embodiment will be described with reference to FIG. 7. The semiconductor memory device 1 according to the second embodiment differs from the one according to the first embodiment in that the intervals P2 and P4 between the second parts 12b of the conductive layers 12 become gradually greater as distance from the memory area 2a increases. The other configuration of the second embodiment are the same as the configuration of the first embodiment.

Figure 7:
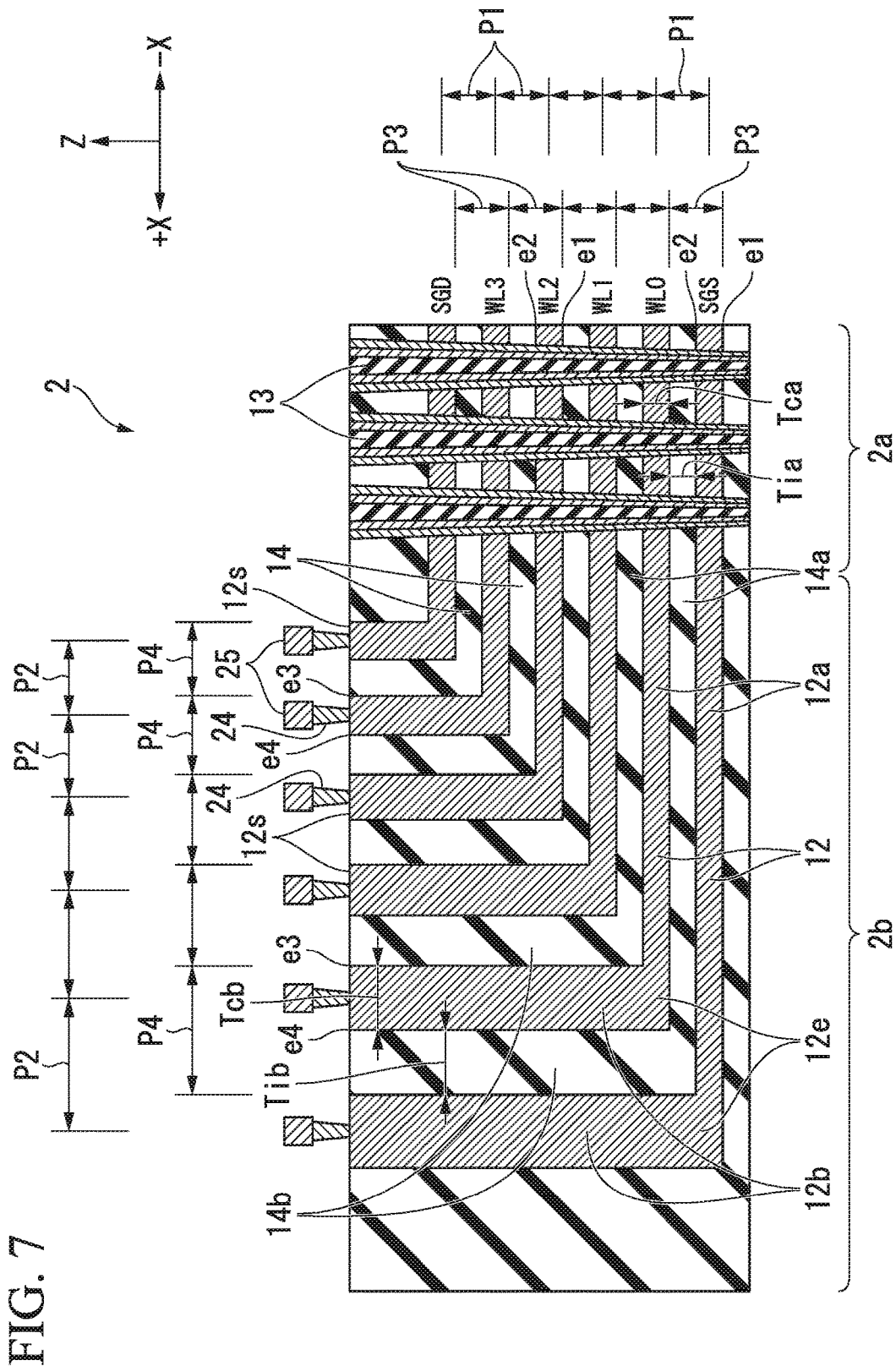
FIG. 7 is a cross-sectional view of a memory cell array according to a second embodiment.

FIG. 7 shows a semiconductor memory device 1 according to the second embodiment. As shown in FIG. 7, the first parts 12a of the plurality of conductive layers 12 are disposed at the uniform first intervals P1 and P3 in the first direction, similarly to the first embodiment.

The second parts 12b of the plurality of conductive layers 12 are disposed at a plurality of second intervals P2 that are mutually different in the second direction. In the present embodiment, the second intervals P2 become gradually greater as the second interval P2 is farther away from the memory area 2a in the second direction. That is, among the plurality of the second intervals P2, the farther the second interval P2 is away from the memory area 2a in the second direction, the greater the second interval P2 is. Also, for example, even the smallest second interval P2 is greater than the first interval P1. In the present embodiment, the second intervals P4 become gradually greater as the second interval P4 is farther away from the memory area 2a in the second direction. That is, among the plurality of the second intervals P4, the farther the second interval P4 is away from the memory area 2a in the second direction, the greater the second interval P4 is. Also, for example, even the smallest second interval P4 is greater than the first interval P3.

In the present embodiment, the thicknesses Tib of the second insulating parts 14b of the plurality of insulating layers 14 in the second direction become gradually thicker, as the second insulating part 14b is farther away from the memory area 2a. That is, among the plurality of the thicknesses Tib of the second insulating parts 14b of the plurality of insulating layers 14, the farther the second insulating part 14b is away from the memory area 2a, the thicker the thicknesses Tib of the second insulating part 14b is.

In the present embodiment, the thicknesses Tcb of the second parts 12b of the plurality of conductive layers 12 in the second direction become gradually thicker, as the second part 12b is farther away from the memory area 2a. That is, among the plurality of the thicknesses Tcb of the second parts 12b of the plurality of conductive layers 12, the farther the second part 12b is away from the memory area 2a, the thicker the thicknesses Tcb of the second part 12b is.

According to a semiconductor memory device 1 of the present embodiment, similarly to the first embodiment, it is possible to miniaturize the semiconductor memory device 1, enable simplified manufacturing, and improve the voltage breakdown margin of the conductive layers 12.

As shown in FIG. 6A to FIG. 6D, in manufacturing of the semiconductor memory device 1, the farther the conductive layer 12 is from the memory area 2a, the later the process step is. For that reason, the farther the conductive layer 12 is from the memory area 2a, the more manufacturing errors accumulate. As a result, the variation in the position of the second part 12b of the conductive layer 12 in the second direction becomes large.

According to the present embodiment, the plurality of conductive layers 12 include a first conductive layer, a second conductive layer, and a third conductive layer. The second conductive layer is adjacent to the first conductive layer among the plurality of conductive layers. The third conductive layer is adjacent to the second conductive layer on the side opposite to the first conductive layer. The second part 12b of the first conductive layer, the second part 12b of the second conductive layer, and the second part 12b of the third conductive layer are arranged in that sequence, being away from the memory area 2a (i.e., the second part 12b of the first conductive layer is farthest from the memory area 2a among the second parts 12b of the three conductive layer, and the second part 12b of the third conductive layer is closest to the memory area 2a among the second parts 12b of the three conductive layer). The interval P4 in the second direction between the third edge e3 of the second part 12b of the first conductive layer and the third edge e3 of the second part 12b of the second conductive layer is greater than the interval P4 in the second direction between the third edge e3 of the second part 12b of the second conductive layer and the third edge e3 of the second part 12b of the third conductive layer. In the present embodiment, each of the "first conductive layer," "second conductive layer," and "third conductive layer" may be any of the word lines WL, the source-side selection gate line SGS, and the drain-side selection gate line SGD. Also, any two or more of the "first conductive layer," the "second conductive layer," and the "third conductive layer" may be word lines WL.

According to the configuration of the present embodiment, the further the second part 12b of a conductive layer 12 is from the memory area 2a, the greater the margin that can be achieved with respect to variation in the position of the second part 12b is formed. For that reason, it is possible to reduce the possibility that the contact plug 24 that should be connected to a conductive layer 12 is connected to another conductive layer 12 that is adjacent to the conductive layer 12.

Next, modifications of the present embodiment will be described. In these modifications, configurations not described below are the same as the configurations of the second embodiment.

(First Modification)

Figure 8:
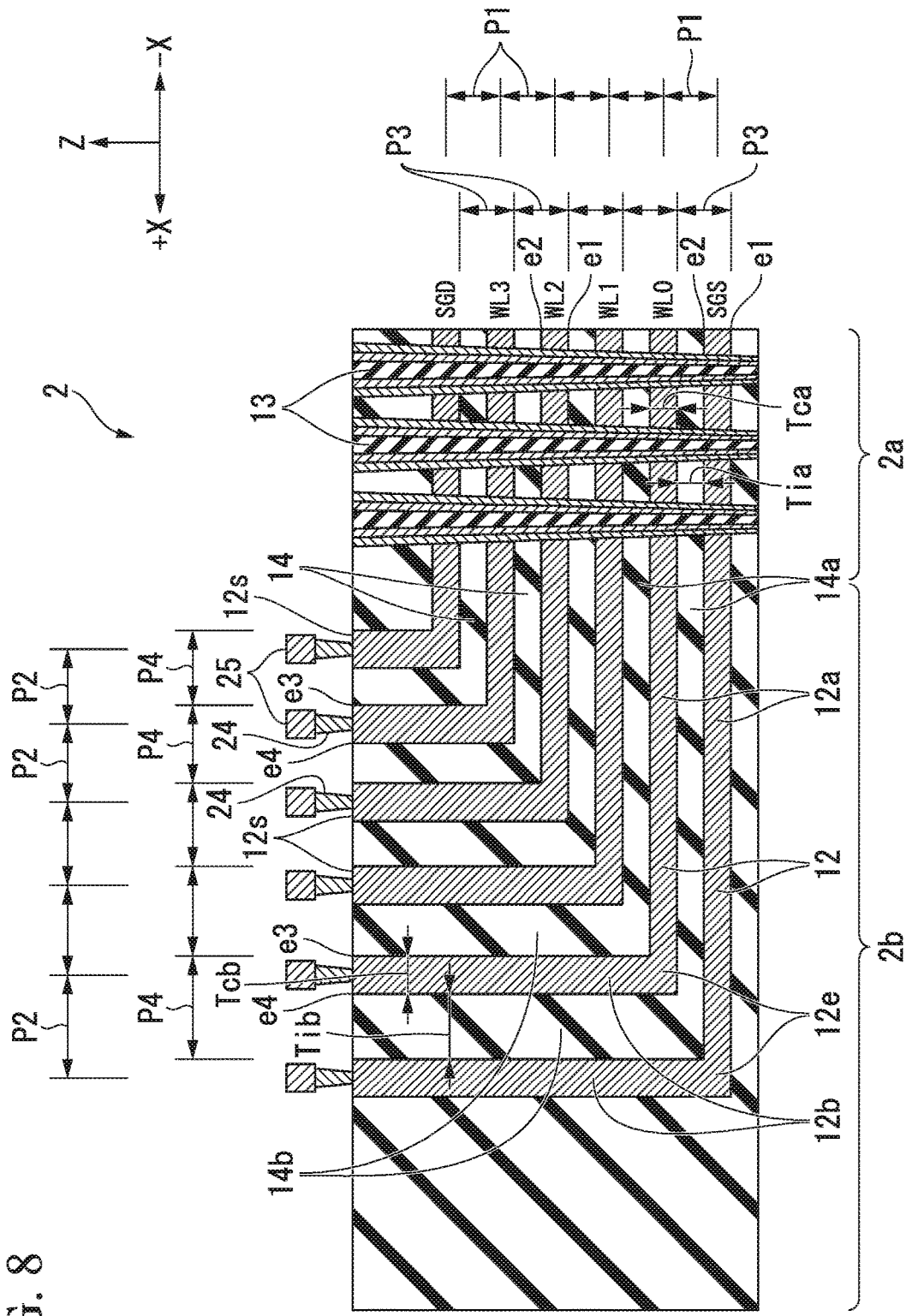
FIG. 8 is a cross-sectional view of a memory cell array according to a first modification of the second embodiment.

FIG. 8 shows a semiconductor memory device 1 according to a first modification of the second embodiment.

As shown in FIG. 8, the thicknesses Tcb of the second parts 12b of the plurality of conductive layers 12 in the second direction are substantially mutually the same in the present modification. In contrast, the thicknesses Tib of the second insulating parts 14b of the plurality of insulating layers 14 in the second direction become greater as the second insulating part 14b is farther away from the memory area 2a. For that reason, the second intervals P2 and P4 gradually increase as each of the second intervals P2 and P4 is away from the memory area 2a.

(Second Modification)

Figure 9:
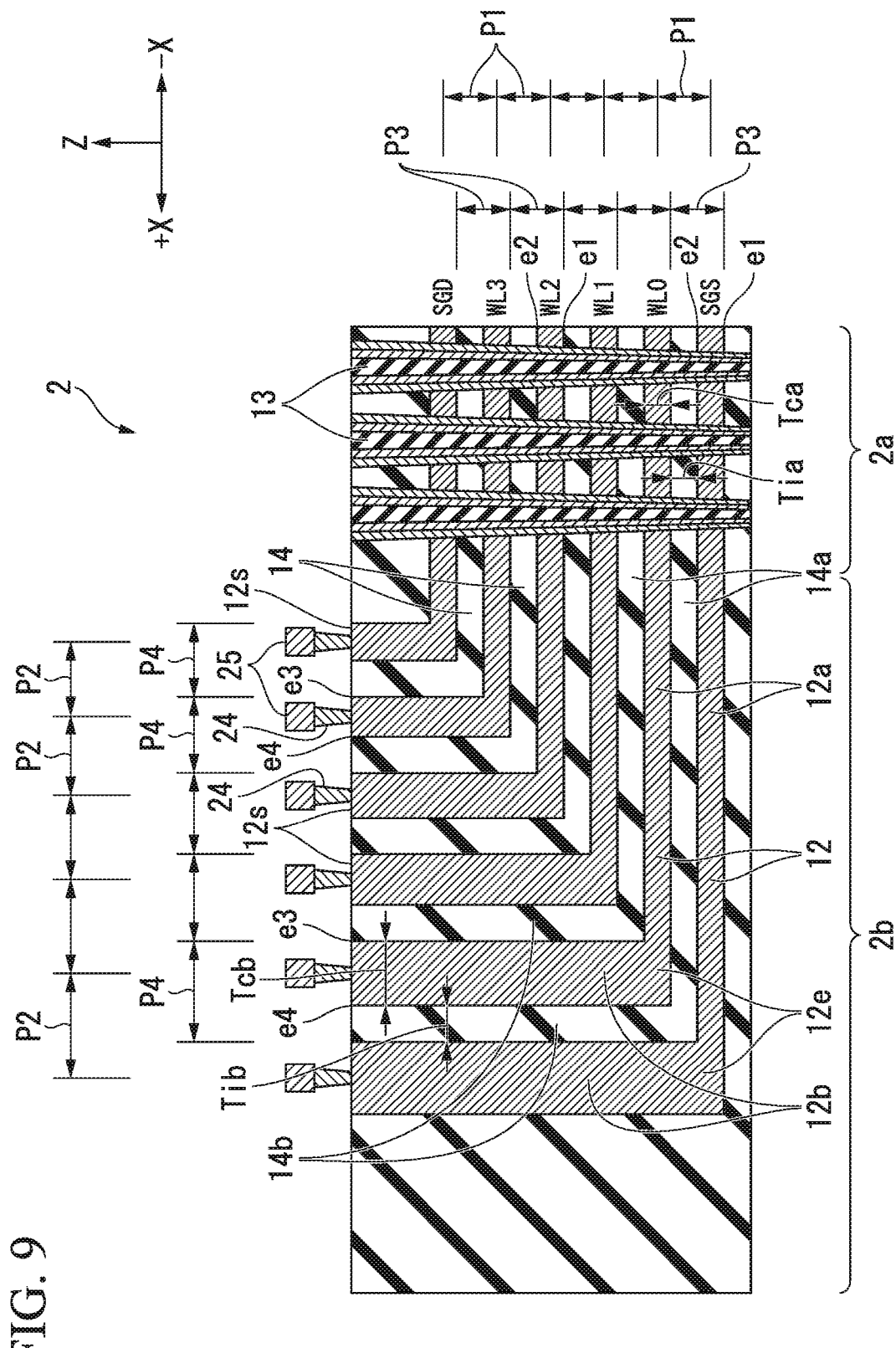
FIG. 9 is a cross-sectional view of a memory cell array according to a second modification of the second embodiment.

FIG. 9 shows a semiconductor memory device 1 according to a second modification of the second embodiment.

As shown in FIG. 9, in the present modification, the thicknesses Tib of the second insulating parts 14b of the plurality of insulating layers 14 in the second direction are substantially mutually the same. In contrast, the thicknesses Tcb of the second parts 12b of the plurality of conductive layers 12 in the second direction become greater, as the second part 12b is farther away from the memory area 2a. For that reason, the second intervals P2 and P4 gradually increase as each of the second intervals P2 and P4 is away from the memory area 2a.

Third Embodiment

Next, a semiconductor memory device 1 according to a third embodiment will be described with reference to FIG. 10. The semiconductor memory device 1 according to the present embodiment differs from the first embodiment in that the intervals between the conductive layers 12 are set to have a plurality of different intervals, based on the operating voltage of the plurality of conductive layers 12. The other configurations of the third embodiment are the same as the configurations of the first embodiment.

Figure 10:
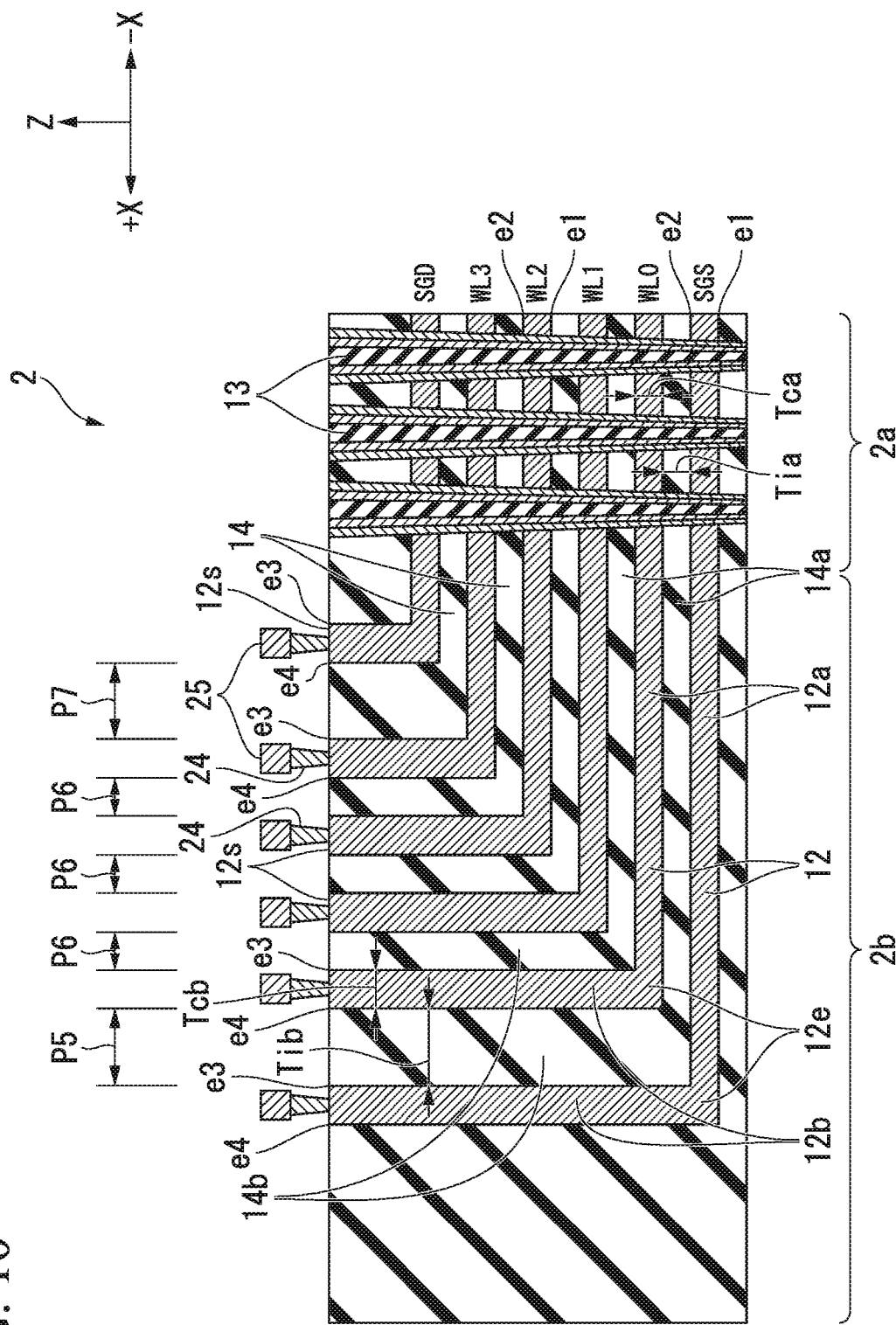
FIG. 10 is a cross-sectional view of a memory cell array according to a third embodiment.

FIG. 10 shows the semiconductor memory device 1 according to the third embodiment.

As shown in FIG. 10, in the present embodiment, the plurality of conductive layers 12 includes the word lines WL0, WL1, WL2, and WL3. The word line WL0 is adjacent to the source-side selection gate line SGS among the plurality of conductive layers 12. The word line WL0 is an example of a "fourth conductive layer." The word line WL3 is adjacent to the drain-side selection gate line SGD among the plurality of conductive layers 12. The word line WL3 is an example of a "fifth conductive layer." The two word lines WL1 and WL2 are adjacent to each other among the plurality of word lines WL. The word line WL1 is adjacent to the word line WL0 on the side opposite to the source-side selection gate line SGS. The word line WL2 is adjacent to the word line WL3 on the side opposite to the drain-side selection gate line SGD. The plurality of conductive layers 12 may actually include more word lines WL.

In the present embodiment, the electric potential difference between the source-side selection gate line SGS and the word line WL0 is greater than the electric potential difference between any pair of adjacent word lines WL among the plurality of word lines WL.

The electric potential difference between the drain-side selection gate line SGD and the word line WL3 is greater than the electric potential difference between any pair of mutually adjacent word lines WL among the plurality of word lines WL.

In the present embodiment, the interval P5 in the second direction between the third edge e3 of the second part 12b of the source-side selection gate line SGS and the fourth edge e4 of the second part 12b of the word line WL0 is greater than the interval P6 in the second direction between any pair of mutually adjacent word lines WL (i.e., the interval P6 in the second direction between the third edge e3 of the second part 12b of one word line WL of the pair and the fourth edge e4 of the second part 12b of the other word line WL of the pair).

In the same manner, the interval P7 in the second direction between the fourth edge e4 of the second part 12b of the drain-side selection gate line SGD and the third edge e3 of the second part 12b of the word line WL3 is greater than the interval P6 in the second direction between any pair of mutually adjacent word lines WL (i.e., the interval P6 in the second direction between the third edge e3 of the second part 12b of one word line WL and the fourth edge e4 of the second part 12b of the other word line WL of the pair).

According to the semiconductor memory device 1 having this configuration, similarly to the above-described first embodiment, it is possible to miniaturize the semiconductor memory device 1, enable simplified manufacturing, and improve the voltage breakdown margin of the conductive layers 12.

From a different standpoint, in the present embodiment, the plurality of conductive layers 12 include a first conductive layer, a second conductive layer, and a third conductive layer. The second conductive layer is adjacent to the first conductive layer among the plurality of conductive layers. The third conductive layer is adjacent to the second conductive layer from the side opposite to the first conductive layer among the plurality of conductive layers. Further, in the present embodiment, an electric potential difference between the first conductive layer and the second conductive layer is greater than an electric potential difference between the second conductive layer and the third conductive layer.

The interval P5 in the second direction between the third edge e3 of the second part 12b of the first conductive layer and the fourth edge e4 of the second part 12b of the second conductive layer is greater than the interval P6 in the second direction between the third edge e3 of the second part 12b of the second conductive layer and the fourth edge e4 of the second part 12b of the third conductive layer. Further, in the present embodiment, the source-side selection gate line SGS is an example of the "first conductive layer," the word line WL0 is an example of a "second conductive layer," and the word line WL1 is an example of a "third conductive layer."

According to the configuration of the present embodiment, it is possible to establish a sufficient distance between second parts 12b of adjacent conductive layers 12, to which a high electric potential difference is applied when the semiconductor memory device 1 operates. This configuration decreases the electric field applied to the second parts 12b of the conductive layers 12, thereby improving the operational stability of the semiconductor memory device 1, while improving the reliability and extending the life thereof.

Next, modifications of the third embodiment will be shown. In these variation examples, configurations not described below are the same as the configuration in the above-noted third embodiment.

(First Modification)

Figure 11:
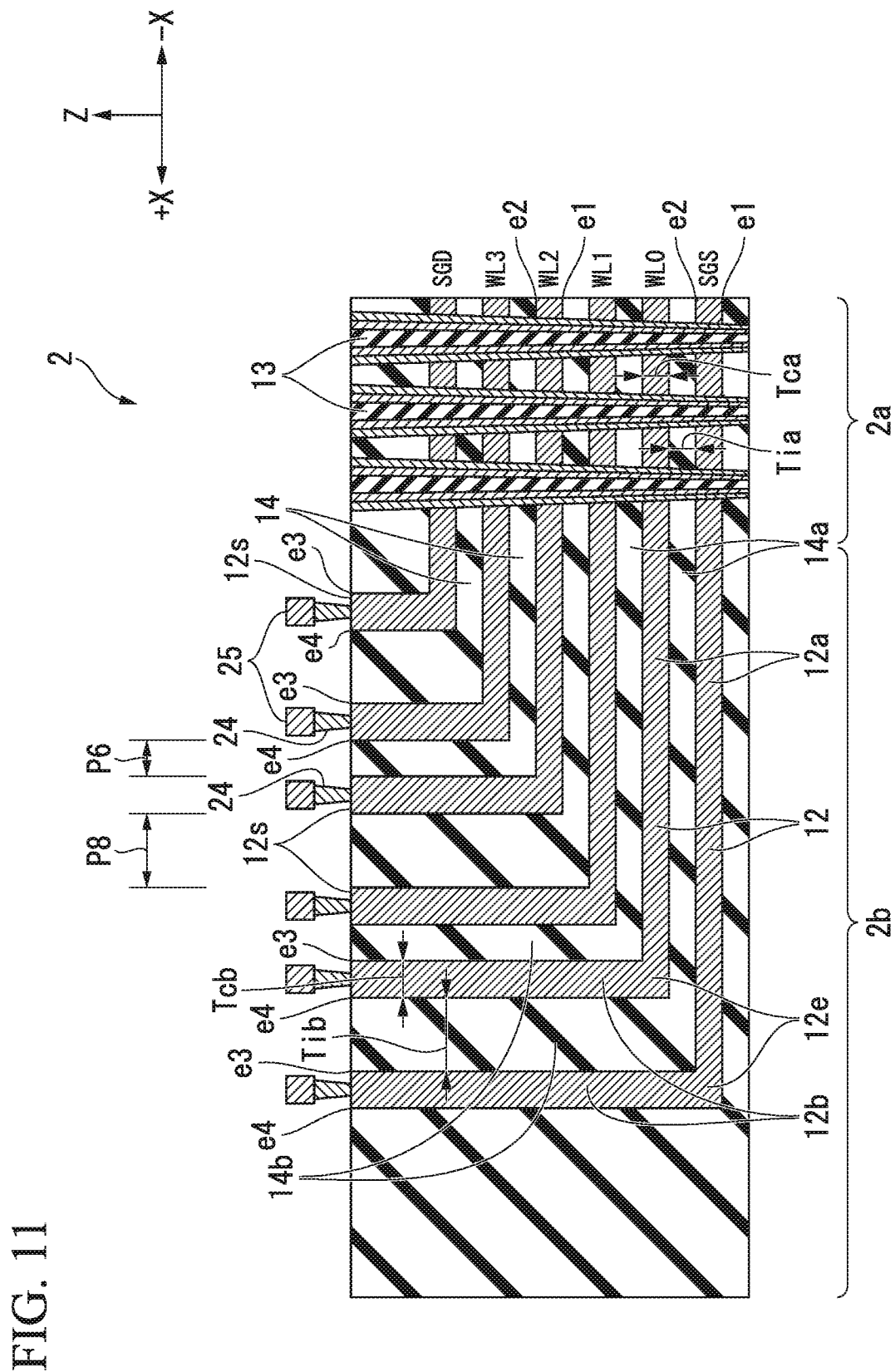
FIG. 11 is a cross-sectional view of a memory cell array according a first modification of the third embodiment.

FIG. 11 shows a semiconductor memory device 1 according to a first modification of the third embodiment.

As shown in FIG. 11, in the present modification, the first conductive layer, second conductive layer, and third conductive layer described above are formed by three word lines WL. That is, the plurality of conductive layer 12 include the three word lines WL1, WL2, and WL3. The word lines WL1 and WL2 are adjacent to each other among the plurality of conductive layers 12. The word lines WL2 and WL3 are adjacent to each other among the plurality of conductive layers 12. The interval P8 in the second direction between the third edge e3 of the second part 12b of the first word line WL1 and the fourth edge e4 of the second part 12b of the second word line WL2 is greater than the interval P6 in the second direction between the third edge e3 of the second part 12b of the second word line WL2 and the fourth edge e4 of the second part 12b of the third word line WL3.

(Second Modification)

Figure 12:
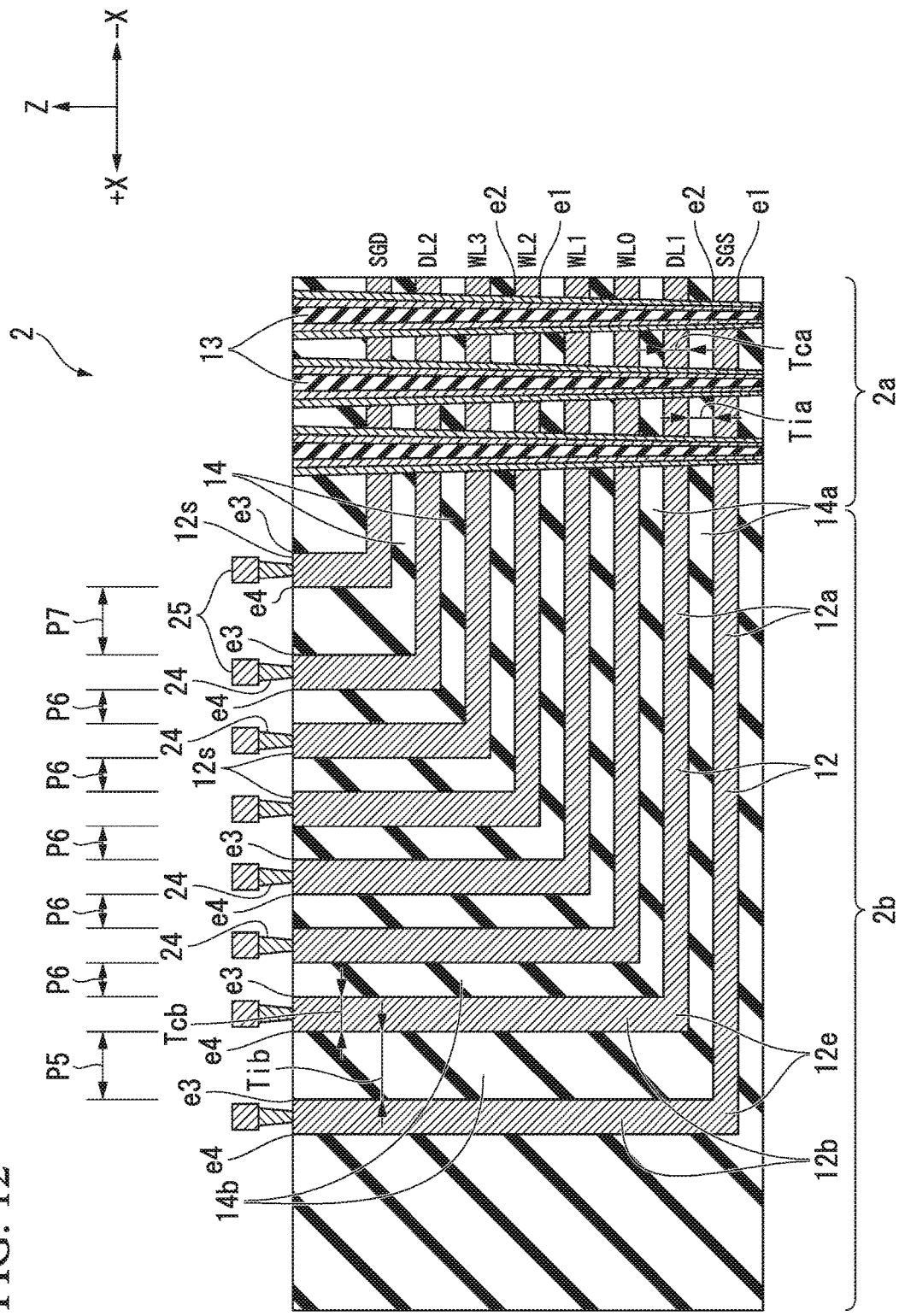
FIG. 12 is a cross-sectional view of a memory cell array according to a second modification of the third embodiment.

FIG. 12 shows a semiconductor memory device 1 according to a second modification of the third embodiment.

In the present modification, the plurality of conductive layers 12 includes a first dummy line DL1 and a second dummy line DL2. The first dummy line DL1 is formed between the source-side selection gate line SGS and the word line WL0. The first dummy line DL1 is adjacent to the source-side selection gate line SGS and to the word line WL0 among the plurality of conductive layer 12. The first dummy line DL1, for example, by being supplied a voltage that is intermediate between the voltage of the source-side selection gate line SGS and the voltage of the word line WL0, decreases the electric field between the source-side selection gate line SGS and the word line WL0.

In the same manner, the second dummy line DL2 is formed between the drain-side selection gate line SGD and the word line WL3. The second dummy line DL2 is adjacent to the drain-side selection gate line SGD and to the word line WL3 among the plurality of conductive layers 12. The second dummy line DL2, by being supplied a voltage that is intermediate between the voltage of the drain-side selection gate line SGD and the voltage of the word line WL3, decreases the electric field between the drain-side selection gate line SGD and the word line WL3.

The interval P5 in the second direction between the third edge e3 of the second part 12b of the source-side selection gate line SGS and the fourth edge e4 of the second part 12b of the first dummy line DL1 is greater than the interval P6 in the second direction between the third edge e3 of the second part 12b of the first dummy line DL1 and the fourth edge e4 of the second part 12b of the word line WL0. In the same manner, the interval P7 in the second direction between the fourth edge e4 of the second part 12b of the drain-side selection gate line SGD and the third edge e3 of the second part 12b of the second dummy line DL2 is greater than the interval P6 in the second direction between the fourth edge e4 of the second part 12b of the second dummy line DL2 and the third edge e3 of the second part 12b of the word line WL3.

In the present modification, the source-side selection gate line SGS is an example of the "first conductive layer," the first dummy line DL1 is an example of the "second conductive layer," and the word line WL0 is an example of the "third conductive layer."

For example, in the present modification, the interval P5 in the second direction between the third edge e3 of the second part 12b of the source-side selection gate line SGS and the fourth edge e4 of the second part 12b of the first dummy line DL1 is greater than the interval P6 between any pair of mutually adjacent word lines WL (i.e., the interval P6 in the second direction between the third edge e3 of the second part 12b of one word line WL of the pair and the fourth edge e4 of the second part 12b of the other word line WL of the pair). In the same manner, the interval P7 in the second direction between the fourth edge e4 of the second part 12b of the drain-side selection gate line SGD and the third edge e3 of the second part 12b of the second dummy line DL2 is greater than the interval P6 between any pair of mutually adjacent word lines WL (i.e., the interval P6 in the second direction between the third edge e3 of the second part 12b of one word line WL of the pair and the fourth edge e4 of the second part 12b of the other word line WL of the pair).

(Third Modification)

Figure 13:
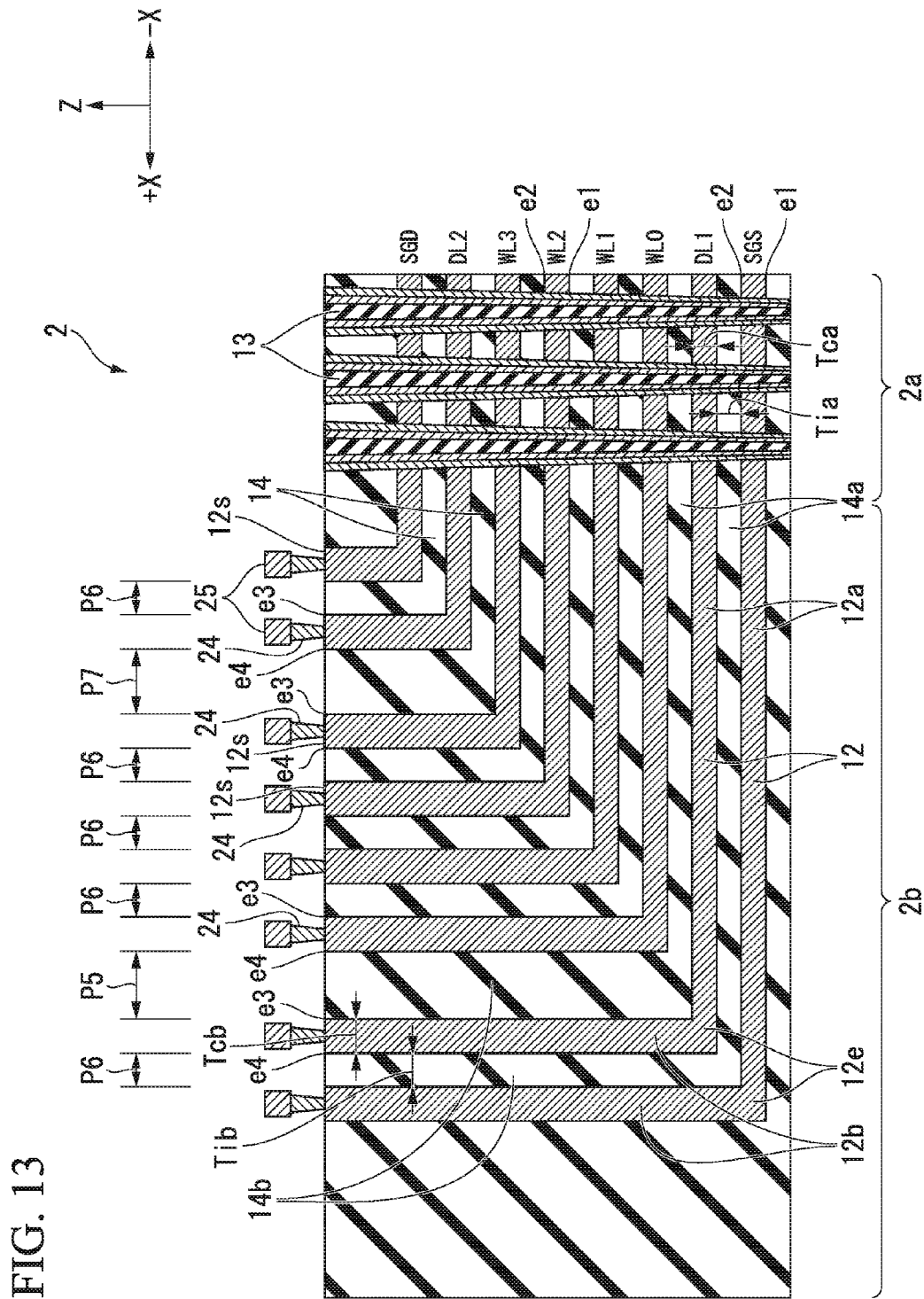
FIG. 13 is a cross-sectional view of a memory cell array according to a third modification of the third embodiment.

FIG. 13 shows a semiconductor memory device 1 according to a third modification of the third embodiment. In the present modification, configurations not described below are the same as the configurations of the second modification.

In the present modification, the plurality of conductive layers 12 includes the word lines WL1 and WL2. The word line WL1 is adjacent to the word line WL0 from the side opposite to the first dummy line DL1 among the plurality of conductive layers 12. The word line WL2 is adjacent to the word line WL3 from the side opposite to the second dummy line DL2 among the plurality of conductive layers 12.

The interval P5 in the second direction between the third edge e3 of the second part 12b of the first dummy line DL1 and the fourth edge e4 of the second part 12b of the word line WL0 is greater than the interval P6 in the second direction between the third edge e3 of the second part 12b of the word line WL0 and the fourth edge e4 of the second part 12b of the word line WL1. In the same manner, the interval P7 in the second direction between the fourth edge e4 of the second part 12b of the second dummy line DL2 and the third edge e3 of the second part 12b of the word line WL3 is greater than the interval P6 in the second direction between the fourth edge e4 of the second part 12b of the word line WL3 and the third edge e3 of the second part 12b of the word line WL2.

In the present modification, the first dummy line DL1 is an example of the "first conductive layer," the word line WL0 is an example of the "second conductive layer," and the word line WL1 is an example of the "third conductive layer."

For example, in the present modification, the interval P5 in the second direction between the third edge e3 of the second part 12b of the first dummy line DL1 and the fourth edge e4 of the second part 12b of the word line WL0 is greater than the interval P6 between any pair of mutually adjacent word lines WL (i.e., the interval P6 in the second direction between the third edge e3 of the second part 12b of one word line WL of the pair and the fourth edge e4 of the second part 12b of the other word line WL of the pair). In the same manner, the interval P7 in the second direction between the fourth edge e4 of the second part 12b of the second dummy line DL2 and the third edge e3 of the second part 12b of the word line WL3 is greater than the interval P6 between any pair of mutually adjacent word lines WL (i.e., the interval P6 in the second direction between the third edge e3 of the second part 12b of one word line WL of the pair and the fourth edge e4 of the second part 12b of the other word line WL of the pair).

Fourth Embodiment

Next, a semiconductor memory device 1 according to a fourth embodiment will be described with references made to FIG. 14. The semiconductor memory device 1 according to the present embodiment differs from the first embodiment in that the intervals P2 and P4 of the second parts 12b of the conductive layers 12 become gradually smaller as each of the interval P2 and P4 is away from the memory area 2a. Other configurations of the fourth embodiment are the same as the configurations of the first embodiment.

Figure 14:
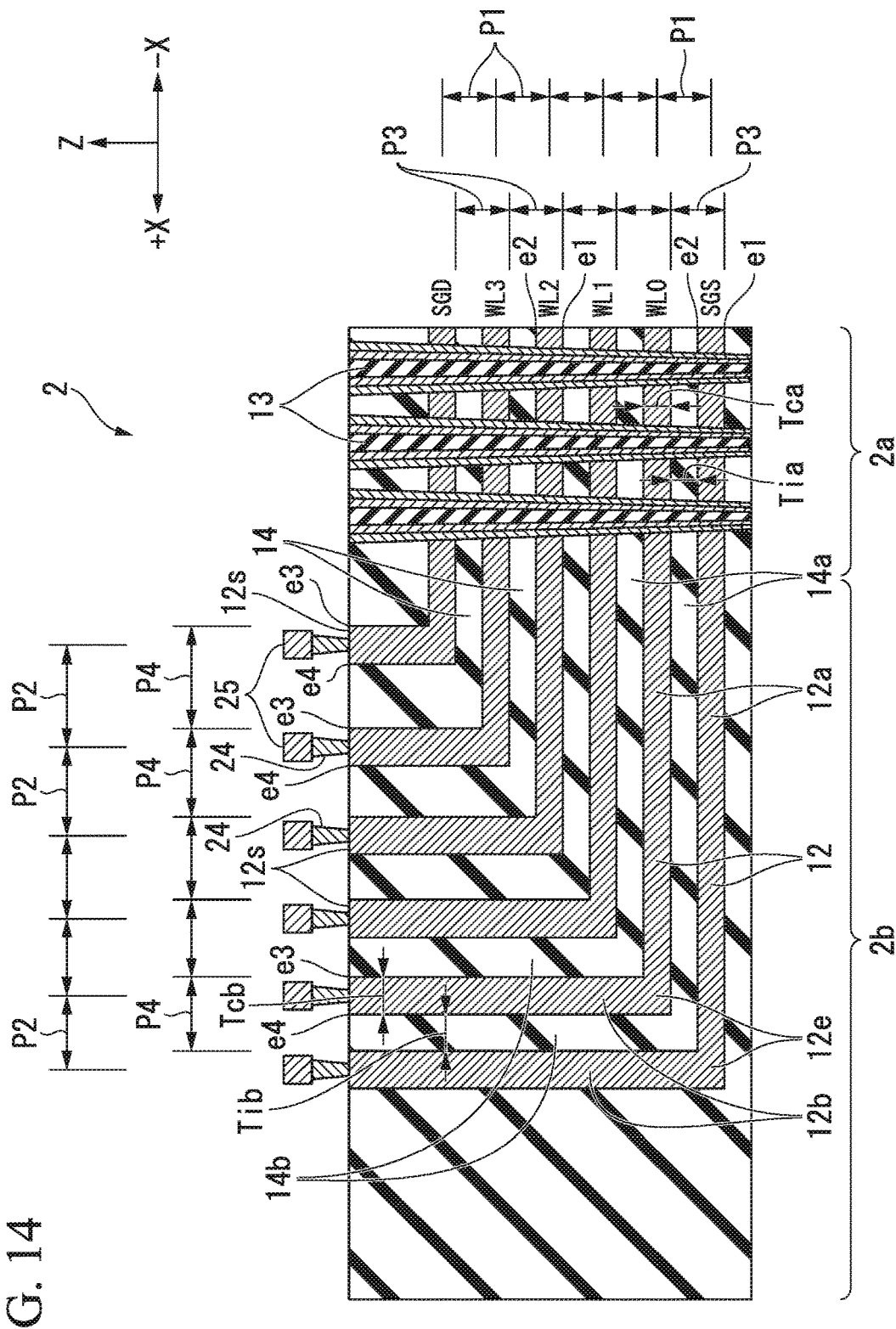
FIG. 14 is a cross-sectional view of a memory cell array according to a fourth embodiment.

FIG. 14 shows the semiconductor memory device 1 according to the fourth embodiment.

As shown in FIG. 14, the first parts 12a of the plurality of conductive layers 12 are disposed at the certain first intervals P1 and P3 in the first direction. That is, the first parts 12a of the plurality of conductive layers 12 are disposed at substantially a uniform interval in the first direction.

In contrast, the second parts 12b of the plurality of conductive layers 12 are disposed in the second direction at different second intervals P2. In the present embodiment, the second intervals P2 becomes gradually smaller as the second interval P2 is farther away from the memory area 2a in the second direction. Also, for example, even the smallest second interval P2 is greater than the first interval P1. That is, among the plurality of the second intervals P2, the farther is the second interval P2 is away from the memory area 2a in the second direction, the smaller the second interval P2 is.

In the present embodiment, the second intervals P4 becomes gradually smaller as the second interval P4 is farther away from the memory area 2a in the second direction. That is, among the plurality of the second intervals P4, the farther the second interval P4 is away from the memory area 2a in the second direction, the smaller the second interval P4 is. Also, for example, even the smallest second interval P4 is greater than the first interval P3.

In the present embodiment, the thicknesses Tib of the second insulating parts 14b of the plurality of insulating layers 14 in the second direction becomes gradually thinner, as the second insulating part 14b is farther away from the memory area 2a. That is, among the plurality of the thicknesses Tib of the second insulating parts 14b of the plurality of insulating layers 14, the farther the second insulating part 14b is away from the memory area 2a, the thinner the thicknesses Tib of the second insulating part 14b is.

In this case, as shown in FIG. 14, the diameter of the memory pillar 13 (e.g., diameter of the memory cell MC) becomes large as being away from the semiconductor substrate 11. Described differently, the farther the memory cell MC is away from the semiconductor substrate 11, the smaller the curvature of the memory cell MC is, making it difficult for an electric field to act on it. For that reason, a relatively high voltage may be supplied to a conductive layer 12 at a further distance from the semiconductor substrate 11 among the plurality of conductive layers 12. In contrast, as to a conductive layer 12 positioned close to the semiconductor substrate 11, even with a relatively low voltage, a sufficient electric field may be applied to the memory cell MC. For that reason, a relatively low voltage may be applied to a conductive layer 12 positioned close to the semiconductor substrate 11 among the plurality of conductive layers 12.

In the present embodiment, the plurality of conductive layers 12 include a first conductive layer, a second conductive layer, and a third conductive layer. The second conductive layer is adjacent to the first conductive layer among the plurality of conductive layers. The third conductive layer is adjacent to the second conductive layer from the side opposite to the first conductive layer among the plurality of conductive layers. The second part 12b of the first conductive layer, the second part 12b of the second conductive layer, and the second part 12b of the third conductive layer are arranged in this order, being away from the memory area 2a (i.e., the second part 12b of the first conductive layer is farthest from the memory area 2a among the second parts 12b of the three conductive layer, and the second part 12b of the third conductive layer is closest to the memory area 2a among the second parts 12b of the three conductive layer). The interval P4 in the second direction between the third edge e3 of the second part 12b of the first conductive layer and the third edge e3 of the second part 12b of the second conductive layer is smaller than the interval P4 in the second direction between the third edge e3 of the second part 12b of the second conductive layer and the third edge e3 of the second part 12b of the third conductive layer. In the present embodiment, the "first conductive layer," the "second conductive layer," and the "third conductive layer" may be any of the word line WL, the source-side selection gate line SGS, and the drain-side selection gate line SGD. Also, any two or more of the "first conductive layer," the "second conductive layer," and the "third conductive layer" may be word lines WL.

According to the configuration of the present embodiment, in addition to supplying a relatively large voltage to a conductive layer 12 at which it is difficult to apply an electric field to a memory cell MC, the voltage breakdown margin of the conductive layers 12 can be improved. The thickness of the second insulating part 14b of the insulating layer 14 adjacent to a conductive layer 12 at which a sufficient electric field is applied to a memory cell MC even with a low voltage may be reduced. This enables a reduction in the size of the semiconductor memory device 1.

Next, one modification of the present embodiment will be described. Configurations not described below are the same as the configurations of the fourth embodiment.

(Modification)

Figure 15:
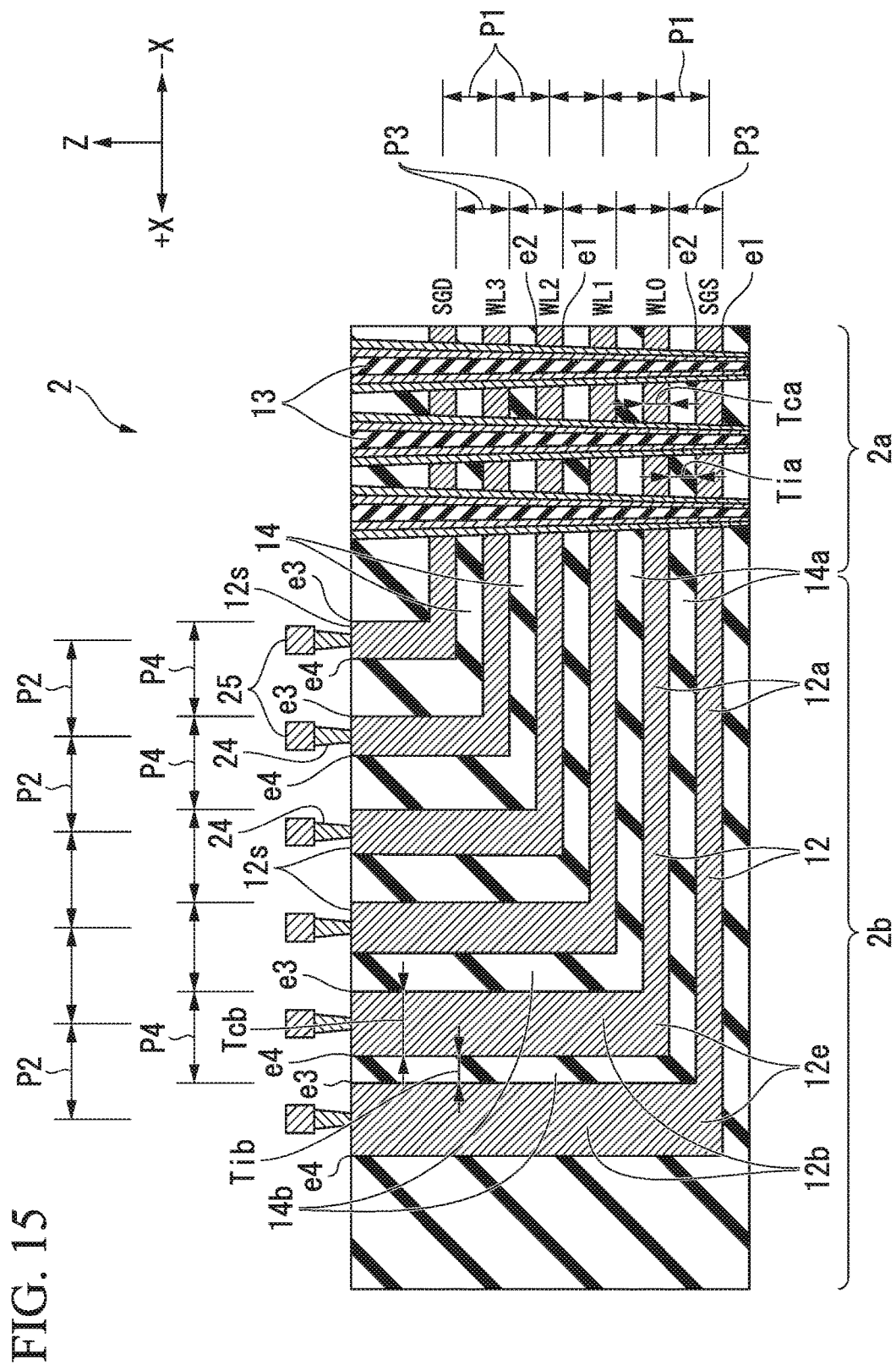
FIG. 15 is a cross-sectional view of a memory cell array according to a modification of the fourth embodiment.

FIG. 15 shows a semiconductor memory device 1 according to a modification of the present embodiment.

In the present modification, the second intervals P2 and P4 are uniform, regardless of the distance from the memory area 2a.

In the present modification, the thicknesses Tib of the second insulating parts 14b of the plurality of insulating layer 14 in the second direction gradually become thinner as the second insulating part 14b is farther away from the memory area 2a. That is, among the plurality of the thicknesses Tib of the second insulating parts 14b of the plurality of insulating layers 14, the farther the second insulating part 14b is away from the memory area 2a, the thinner the thicknesses Tib of the second insulating part 14b is.

In contrast, in the present modification, the thicknesses Tcb of the second parts 12b of the plurality of conductive layers 12 in the second direction gradually become thicker as the second part 12b is farther away from the memory area 2a. That is, among the plurality of the thicknesses Tcb of the second parts 12b of the plurality of conductive layers 12, the farther the second part 12b is away from the memory area 2a, the thicker the thicknesses Tcb of the second part 12b is. In the present modification, the amount of thinning of the second insulating part 14b of the insulating layer 14 as being away from the memory area 2a and the amount of thickening of the second part 12b of the conductive layer 12 as being away from the memory area 2a are substantially the same. For that reason, in the present modification, the second intervals P2 and P4 are uniform.

The first to fourth embodiments and the modifications thereof have been described above. However, the configurations of the embodiments are not limited to the above. For example, a memory string MS may have a U shape, i.e., may be folded back on the opposite side in the memory string MS. The memory cell MC is not limited to a Metal-Oxide-Nitride-Oxide-Semiconductor (MONOS) type memory cell, and may be, for example, a Semiconductor-Oxide-Nitride-Oxide-Semiconductor (SONSO) type memory cell or a floating gate type memory cell.

According to at least one of the above-described embodiments, each of the first parts of a plurality of conductive layers has, in a first direction, a first edge and a second edge that is opposite to the first edge. Each of the second parts of the plurality of conductive layers has, in a second direction, a third edge and a fourth edge that is opposite to the third edge. The plurality of conductive layers include a first conductive layer and a second conductive layer. An interval, in the second direction, between the third edge of the second part of the first conductive layer and the third edge of the second part of the second conductive layer is greater than an interval, in the first direction, between the first edge of the first part of the first conductive layer and the first edge of the first part of the second conductive layer. According to such a configuration, it is possible to reduce the size of the semiconductor memory device.

From a different standpoint, according to at least one embodiment, a semiconductor device includes a substrate, a plurality of conductive layers, a plurality of insulating layers, and a plurality of contacts. Each of the plurality of conductive layers has at least a first part and a second part. The first parts of the plurality of the conductive layers are stacked in a first direction that is a thickness direction of the substrate. The second part extends from an end of the first part in a direction that is different from a direction in which the first part extends. The second parts of the plurality of the conductive layers are arranged in a second direction that is different from the first direction. The plurality of insulating layers are each between two adjacent conductive layers included in the plurality of conductive layers. The plurality of contacts are connected to the second parts of the plurality of conductive layers. The plurality of conductive layers includes a first conductive layer and a second conductive layer. An interval between a center line of a thickness in the second direction on an end surface of the second part of the first conductive layer and a center line of a thickness in the second direction on an end surface of the second part of the second conductive layer is greater than an interval between a center line of a thickness in the first direction of the first part of the first conductive layer and a center line of a thickness in the first direction of the first part of the second conductive layer.

While certain embodiments of the present inventions have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a substrate having a memory region and a peripheral region that are adjacent to each other; and
    a plurality of insulating layers and a plurality of wiring layers that are alternately formed on the memory region and the peripheral region of the substrate, wherein
    on the memory region, the insulating layers and the wiring layers are alternately formed along a thickness direction of the memory device,
    on the peripheral region, first portions of the insulating layers and first portions of the wiring layers are alternately formed along the thickness direction and second portions of the insulating layers and second portions of the wiring layers are alternately formed along a lateral direction, and
    a width of the second portion of each of the wiring layers in the lateral direction is greater than a thickness of the first portion thereof.

2. The semiconductor memory device according to claim 1, wherein
    a width of the second portion of each of the insulating layers in the lateral direction is greater than a thickness of the first portion thereof.

3. The semiconductor memory device according to claim 2, wherein
    thicknesses of the first portions of the wiring layers are uniform, and
    thicknesses of the first portions of the insulating layers are uniform.

4. The semiconductor memory device according to claim 3, wherein
    widths of the second portions of the wiring layers are uniform, and
    widths of the second portions of the insulating layers are uniform.

5. The semiconductor memory device according to claim 3, wherein
    widths of the second portions of the wiring layers become wider as a distance from the memory region increases, and
    widths of the second portions of the insulating layers become wider as a distance from the memory region increases.

6. The semiconductor memory device according to claim 3, wherein
widths of the second portions of the wiring layers are uniform, and
widths of the second portions of the insulating layers become wider as a distance from the memory region increases.

7. The semiconductor memory device according to claim 3, wherein
widths of the second portions of the wiring layers become wider as a distance from the memory region increases, and
widths of the second portions of the insulating layers are uniform.

8. The semiconductor memory device according to claim 3, wherein
widths of the second portions of the wiring layers are uniform, and
widths of the second portions of the insulating layers become narrower as a distance from the memory region increases.

9. The semiconductor memory device according to claim 3, wherein
widths of the second portions of the wiring layers become wider as a distance from the memory region increases, and
widths of the second portions of the insulating layers become narrower as a distance from the memory region increases.

10. The semiconductor memory device according to claim 3, wherein
the plurality of wiring layers includes a source-side selection gate line, a drain-side selection gate line, and a plurality of word lines formed between the source-side selection gate line and the drain-side selection gate line.

11. The semiconductor memory device according to claim 10, wherein
a width of the second portion of an insulating layer formed between the source-side selection gate line and a word line closest thereto is wider than a width of the second portion of each insulating layer formed between two adjacent word lines.

12. The semiconductor memory device according to claim 10, wherein
a width of the second portion of an insulating layer formed between the drain-side selection gate line and a word line closest thereto is wider than a width of the second portion of each insulating layer formed between two adjacent word lines.

13. A semiconductor memory device comprising:
a substrate having a memory region and a peripheral region that are adjacent to each other; and
a plurality of insulating layers and a plurality of wiring layers that are alternately formed on the memory region and the peripheral region of the substrate, wherein
on the memory region, the insulating layers and the wiring layers are alternately formed along a thickness direction of the memory device,
on the peripheral region, first portions of the insulating layers and first portions of the wiring layers are alternately formed along the thickness direction and second portions of the insulating layers and second portions of the wiring layers are alternately formed along a lateral direction, and
a width of the second portion of each of the insulating layers in the lateral direction is greater than a thickness of the first portion thereof.

14. The semiconductor memory device according to claim 13, wherein
thicknesses of the first portions of the wiring layers are uniform, and
thicknesses of the first portions of the insulating layers are uniform.

15. The semiconductor memory device according to claim 14, wherein
widths of the second portions of the wiring layers are uniform, and
widths of the second portions of the insulating layers are uniform.

16. The semiconductor memory device according to claim 14, wherein
widths of the second portions of the wiring layers become wider as a distance from the memory region increases, and
widths of the second portions of the insulating layers become wider as a distance from the memory region increases.

17. The semiconductor memory device according to claim 14, wherein
widths of the second portions of the wiring layers are uniform, and
widths of the second portions of the insulating layers become wider as a distance from the memory region increases.

18. The semiconductor memory device according to claim 14, wherein
widths of the second portions of the wiring layers become wider as a distance from the memory region increases, and
widths of the second portions of the insulating layers are uniform.

19. The semiconductor memory device according to claim 14, wherein
widths of the second portions of the wiring layers become wider as a distance from the memory region increases, and
widths of the second portions of the insulating layers become narrower as a distance from the memory region increases.

* * * * *